(12) United States Patent
Jayaraman et al.

(10) Patent No.: US 6,451,945 B1
(45) Date of Patent: *Sep. 17, 2002

(54) MODIFIED POLYCYCLIC POLYMERS

(75) Inventors: Saikumar Jayaraman, Twinsburg; George Martin Benedikt, Solon; Larry Funderburk Rhodes, Silver Lake; Richard Vicari, Strongsville, all of OH (US); Robert David Allen, San Jose, CA (US); Richard Anthony DiPietro, San Jose, CA (US); Ratnam Sooriyakumaran, San Jose, CA (US); Thomas Wallow, Union City, CA (US)

(73) Assignees: The B.F. Goodrich Company, Charlotte, NC (US); International Business Machines Corp., Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/253,499

(22) Filed: Feb. 19, 1999

Related U.S. Application Data

(60) Provisional application No. 60/075,558, filed on Feb. 23, 1998.

(51) Int. Cl.⁷ .............................................. C08F 132/08
(52) U.S. Cl. ..................... 526/281; 526/270; 526/279; 526/266
(58) Field of Search ................................ 526/281, 271, 526/279, 266

(56) References Cited

U.S. PATENT DOCUMENTS 5,912,313 A * 6/1999 McIntosh, III et al. ..... 526/279
6,147,177 A * 11/2000 Jayaraman et al. ......... 526/281

FOREIGN PATENT DOCUMENTS

| EP | 0789278 | 8/1997 |
| WO | 9733198 | 9/1997 |
| WO | 97/33198 | * 9/1997 |

OTHER PUBLICATIONS

Patent Abstracts of Japan, Publication No. 6002845, Mar. 26, 1985.

* cited by examiner

*Primary Examiner*—Margaret G. Moore
(74) *Attorney, Agent, or Firm*—Thoburn T. Dunlap; Hudak & Shunk Co., LPA

(57) ABSTRACT

The present invention relates to cyclic polymers and their use in photolithographic applications. The cyclic polymers contain a pendant acid labile functional group and a functional group containing a protected hydroxyl moiety. The polymers are post modified by deprotecting the pendant hydroxyl moiety and reacting the deprotected hydroxyl containing moiety with a coreactant. The post-functionalized polymers find application in chemically amplified photoresist compositions.

5 Claims, 6 Drawing Sheets

MODIFIED POLYCYCLIC POLYMERS

This application claims the benefit of U.S. provisional application No. 60/075,558, Feb. 25, 1998.

BACKGROUND OF THE INVENTION

1. Technical Field

The present invention relates to polycyclic polymers and methods for their use in photolithographic applications. More specifically, the invention is related to the modification of polycyclic polymers containing pendant functional groups and to their uses in photoresist compositions for the manufacture of integrated circuits (IC's).

2. Background

Trends in the electronics industry continually require IC's that are faster, and consume less power. To meet these specifications the IC must be of a high density having sub-micron feature dimensions. Conducting lines must be made thinner and placed closer together. Reducing the spacing between conductive lines results in a concomitant increase in the efficiency of the IC enabling a greater storage capacity and faster processing of information on a computer chip. To achieve thinner line widths and smaller feature sizes higher patterning resolution is necessary.

The patterning of IC's is carried out according to various lithography techniques known in the art. Photolithography employing ultraviolet (UV) light and increasingly deep UV light or other radiation is a fundamental and important technology utilized in the production of IC devices. A photosensitive polymer film (photoresist) is applied over a substrate surface (e.g., wafer) and dried. A photomask containing the desired patterning information is then placed in close proximity to the photoresist film. The photoresist is irradiated through the overlying photomask by one of several types of imaging radiation including UV light, electron beams, x-rays, or ion beams. Upon exposure to radiation, the photoresist undergoes a chemical change with attendant changes in solubility. After irradiation, the substrate is soaked in a solution that develops (i.e., selectively removes either the exposed or unexposed regions) the patterned selectively removes either the exposed or unexposed regions) the patterned images in the photosensitive polymer film. Depending on the type of photoresist used, or the polarity of the developing solvent, either the exposed or nonexposed areas of film are removed in the developing process to expose the underlying substrate, after which the patterned exposed or unwanted substrate material is removed or changed by an etching process leaving the desired pattern in a functional layer of the wafer. The remaining photoresist material functions as a protective barrier against the etching process. Removal of the remaining photoresist material gives the patterned circuit. Etching is accomplished by plasma etching, sputter etching, and reactive ion etching (RIE).

Etching generally involves passing a gas through a chamber and ionizing the gas by applying a potential across two electrodes in the presence of the gas. The plasma containing the ionic species generated by the potential is used to etch a substrate placed in the chamber. The ionic species generated in the plasma are directed to the patterned substrate where they interact with the surface material forming volatile products that are removed from the surface. Reactive ion etching provides well defined vertical sidewall profiles in the substrate as well as substrate to substrate etching uniformity. Because of these advantages, the reactive ion etching technique has become the standard in IC manufacture.

In the manufacture of high density IC's the coating, exposure, and development of the photoresist film is critical. It is important to control the line width of the imaged and developed photoresist to close tolerances. The profiles of the patterned photoresist structures must be straight with vertical sidewalls. In addition, the patterned resist must be tolerant to subsequent IC processing steps such as RIE. These high performance polymer resists require superior tuning of several polymer properties such as hydrophilicity, adhesion, differential solubilities between the radiation exposed and unexposed regions (e.g., good resolution and contrast capabilities) and RIE resistance. Accordingly, chemically amplified resist compositions are becoming favored in the manufacture of these high density IC devices.

U.S. Pat. No. 4,491,628 to Ito et al. discloses a chemically amplified photoresist composition containing a photosensitive acid generator and a polymeric component having pendant acid labile groups including t-butyl esters of carboxylic acids and t-butyl carbonates of phenols.

U.S. Pat. No. 5,372,912 to Allen et al. discloses a chemically amplified photoresist composition comprising an acrylate based copolymer, a phenolic binder and a photosensitive acid generator. The copolymer component comprises the reaction product of acrylic or methacrylic acid, alkyl acrylates or methacrylates, and a monomer having a pendant acid labile group such as t-butyl esters of carboxylic and t-butyl carbonates of phenols. The properties of the copolymer can be tailored by varying the content of the disclosed monomers.

International Patent Application Publication WO 97/33198 to The B.F. Goodrich Company discloses a chemically amplified photoresist composition comprising a polycyclic polymer containing repeating units having pendant acid labile groups. Additionally, the polymer may contain polycyclic repeating units having a variety of pendant neutral groups, acid groups, alkyl groups, and mixtures thereof. These polycyclic polymers have exhibited good transparency to short wave length imaging radiation while being resistant to RIE processing techniques. In addition, the wide variety of applicable functional groups enable the artisan to tailor the properties of the polymer to a wide range of specifications. The acid labile groups on the polymer are cleaved to confer polarity or solubility to the polymer, while the neutral groups function to impart hydrophilicity, solubility, promote wetting, and improve film properties. The pendant acid group contributes to the hydrophilicity/wetting of the polymer as well as conferring adhesive characteristics thereto. Pendant alkyl substituents are useful to vary the Tg of the polymer system.

While the foregoing polycyclic polymers exhibit flexibility in property tailoring for high performance photoresist applications through the use of selected pendant functional groups, a drawback exists in that cycloolefinic monomers containing certain of these functionalities are difficult to efficiently polymerize directly. For example, hydroxyl (e.g., alcohols, carboxylic acids, phenols) and nitrogen (e.g., amides, nitrites) containing functionalities may inhibit the catalyst system utilized to polymerize these functional cycloolefin monomers, resulting in reduced yields of the desired polymer. In addition, cycloolefin monomers with certain functional groups may be difficult to synthesize and purify via conventional synthesis routes or might not always be commercially available. Accordingly, there is a need for alternate synthesis routes for photoresist polymers having pendant functional groups that are technically feasible, efficient, and economical.

SUMMARY OF THE INVENTION

It is a general object of the invention to provide alternate methods for functionalizing polymers useful in photoresist compositions.

It is a further object of the invention to post-functionalize polymers comprising polycyclic repeating units.

It is still a further object of the invention to post-functionalize a polycyclic polymer comprising repeating units containing pendant acid labile moieties.

It is another object of the invention to provide alternate methods of functionalizing polycyclic polymers with hydroxyl, nitrogen and sulfur containing groups.

It is still another object of the invention to introduce carboxylic acid containing moieties into a polycyclic polymer backbone through a post-functionalization reaction.

It is another object of the invention to provide photoresist polymers with increased hydrophilicity.

It has been found that the above described objects of the present invention are accomplished by a method for preparing a polycyclic polymer suitable for use in photoresist compositions by introducing difficult to polymerize functionalities into the polymer via a post-functionalization process, said process comprising: (a) providing a polycyclic base polymer composition comprising repeating units containing pendant acid labile groups and repeating units containing pendant protected hydroxyl containing moieties; (b) deprotecting the hydroxyl containing moieties to give a free hydroxyl group; and (c) reacting the free hydroxyl group with a coreactive moiety to give a post-functionalized moiety.

DETAILED DESCRIPTION

Figure 1:
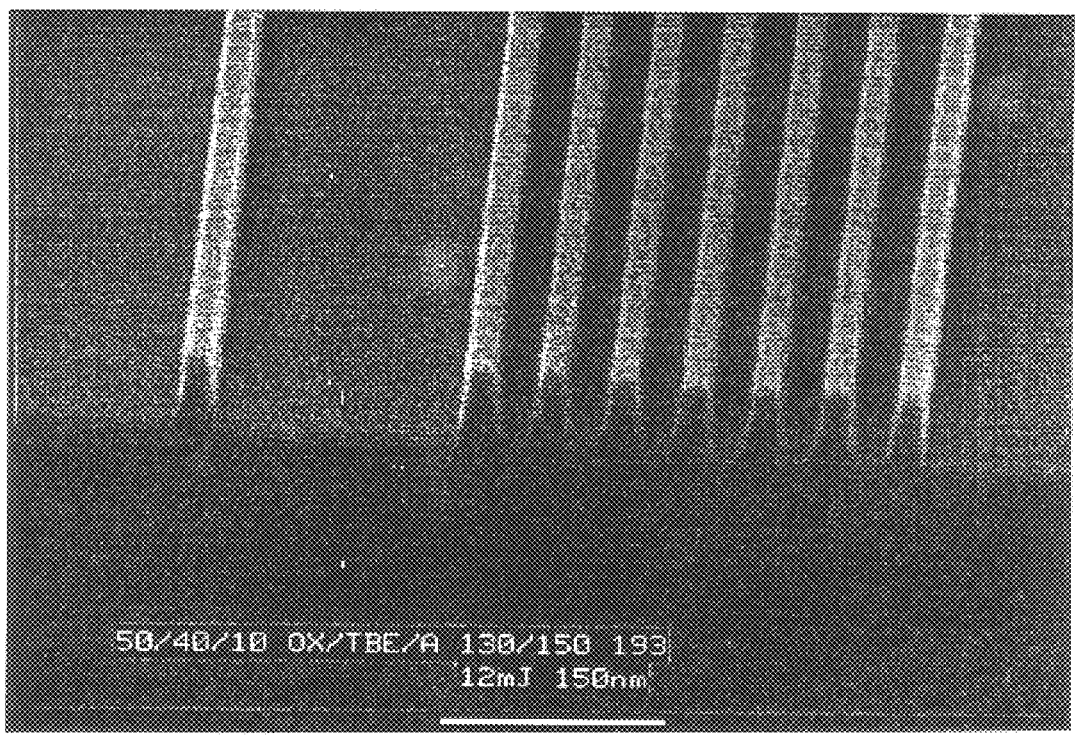
FIG. 1 is a SEM micrograph of a printed image on a 50/50 oxalate/t-butyl ester resist polymer at 0.30 micron feature resolution.

This invention is directed to a process for the direct incorporation of functional groups into a base polymer comprising polycyclic repeating units containing pendant acid labile groups and polycyclic repeating units containing a pendant moiety having a protected hydroxyl group. The post-functionalized polymers find application in chemically amplified photoresist compositions. The process of the present invention useful in situations where the desired functional group can not be incorporated into the polymer by the direct polymerization of monomers containing the desired functionality.

In one aspect of the invention a base polymer comprising polycyclic repeating units set forth under Formulae I and II described below is post-functionalized to give a polymer suitable for chemically amplified photoresist applications. The repeating units of Formula I contain a pendant acid labile group and the repeating units set forth under Formula II contain a pendant protected hydroxyl containing moiety. In addition, the base polymer composition can optionally contain polycyclic repeating units described under Formula III below. The base polymer of the invention is post-functionalized through the pendant protected hydroxyl containing moiety.

The acid labile containing repeating units of the invention are represented by Formula I below.

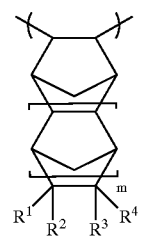

I wherein $R^1$ to $R^4$ independently represent a substituent selected from the group —$(A)_nC(O)OR^*$, —$(A)_n$—$C(O)OR$, —$(A)_n$—$OR$, —$(A)_n$—$OC(O)R$, —$(A)_n$—$C(O)R$, —$(A)_n$—$OC(O)OR$, —$(A)_n$—$OCH_2C(O)OR^*$, —$(A)_n$—$C(O)O$—$A'$—$OCH_2C(O)OR^*$, —$(A)_n$—$OC(O)$—$A'$—$C(O)OR^*$, —$(A)_n$—$C(R)_2CH(R)(C(O)OR^{})$, and —$(A)_n$—$C(R)_2CH(C(O)OR^{})_2$ subject to the proviso that at least one of $R^1$ to $R^4$ is selected from an acid labile group containing $R^*$, preferably, —$(A)_nC(O)OR^*$.

A and A' independently represent a divalent bridging or spacer radical selected from divalent hydrocarbon radicals, divalent cyclic hydrocarbon radicals, divalent oxygen containing radicals, and divalent cyclic ethers and cyclic diethers, m is an interger from 0 to 10, preferably, 0 or 1; and n is an integer of 0 or 1. When n is 0 it should be apparent that A represents a single covalent bond. By divalent is meant that a free valence at each terminal end of the radical are attached to two distinct groups. The divalent hydrocarbon radicals can be represented by the formula —$(C_dH_{2d})$— where d represents the number of carbon atoms in the alkylene chain and is an integer from 1 to 10. The divalent hydrocarbon radicals are preferably selected from linear and branched ($C_1$ to $C_{10}$) alkylene such as methylene, ethylene, propylene, butylene, pentylene, hexylene, heptylene, octylene, nonylene, and decylene. When branched alkylene radicals are contemplated, it is to be understood that a hydrogen atom in the linear alkylene chain is replaced with a linear or branched ($C_1$ to $C_5$) alkyl group.

The divalent cyclic hydrocarbon radicals include substituted and unsubstituted ($C_3$ to $C_8$) cycloaliphatic moieties represented by the formula:

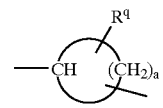

wherein a is an integer from 2 to 7 and $R^q$ when present represents linear and branched ($C_1$ to $C_{10}$) alkyl groups. Preferred divalent cycloalkylene radicals include cyclopen tylene and cyclohexylene moieties represented by the following structures:

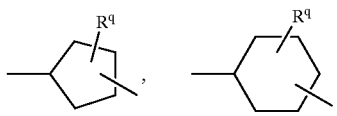

wherein $R^q$ is defined above. As illustrated here and throughout this specification, it is to be understood that the two bond lines projecting from the cyclic structures and/or formulae represent the divalent nature of the moiety and indicate the points at which the carbocyclic atoms are bonded to the adjacent molecular moieties defined in the respective formulae. As is conventional in the art, the diagonal bond line projecting from the center of the cyclic structure indicates that the bond is optionally connected to any one of the carbocyclic atoms in the ring. It is also to be understood that the carbocyclic atom to which the bond line is connected will accommodate one less hydrogen atom to satisfy the valence requirement of carbon.

Preferred divalent cyclic ethers and diethers are represented by the structures:

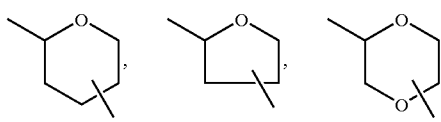

The divalent oxygen containing radicals include ($C_2$ to $C_{10}$) alkylene ethers and polyethers. By ($C_2$ to $C_{10}$) alkylene ether is meant that the total number of carbon atoms in the divalent ether moiety must at least be 2 and can not exceed 10. The divalent alkylene ethers are represented by the formula -alkylene-O-alkylene- wherein each of the alkylene groups that are bonded to the oxygen atom can be the same or different and are selected from methylene, ethylene, propylene, butylene, pentylene, hexylene, heptylene, octylene, and nonylene. The simplest divalent alkylene ether of the series is the radical —$CH_2$—O—$CH_2$—. Preferred polyether moieties include divalent radicals of the formula:

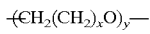

wherein x is an integer from 1 to 5 and y is an integer from 2 to 50 with the proviso that the terminal oxygen atom on the polyether spacer moiety can not be directly linked to a terminal oxygen atom on an adjacent group to form a peroxide linkage. In other words, peroxide linkages (i.e., —O—O—) are not contemplated when polyether spacers are linked to any of the terminal oxygen containing substituent groups set forth under $R^1$ to $R^4$ above.

In the above formulae R represents linear and branched ($C_1$ to $C_{10}$) alkyl. R* represents moieties (i.e., acid labile, blocking or protecting groups) that are cleavable by photoacid initiators selected from —$C(CH_3)_3$, —$CH(R^P)OCH_2CH_3$, —$CH(R^P)OC(CH_3)_3$, or the following cyclic groups:

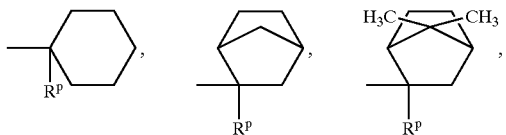

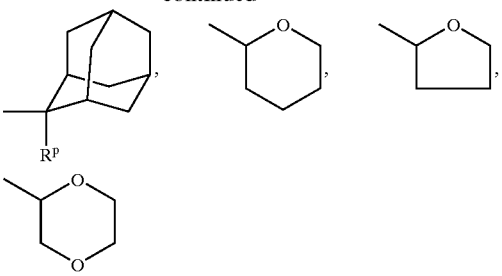

$R^P$ represents hydrogen or a linear or branched ($C_1$ to $C_5$) alkyl group. The alkyl substituents include methyl, ethyl, propyl, i-propyl, butyl, i-butyl, t-butyl, pentyl, t-pentyl and neopentyl. In the above structures, the single bond line projecting from the cyclic groups indicates the carbon atom ring position where the protecting group is bonded to the respective substituent. Examples of acid labile groups include 1-methyl-1-cyclohexyl, isobornyl, 2-methyl-2-isobornyl, 2-methyl-2-adamantyl, tetrahydrofuranyl, tetrahydropyranyl, 3-oxocyclohexanonyl, mevalonic lactonyl, 1-ethoxyethyl, 1-t-butoxy ethyl, dicyclopropylmethyl (Dcpm), and dimethylcyclopropylmethyl (Dmcp) groups. R** independently represents R and R* as defined above. The Dcpm and Dmcp groups are respectively represented by the following structures:

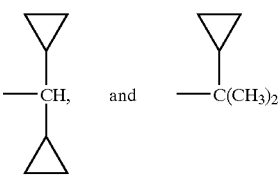

Polycyclic monomers of the above formula with a substituent selected from the group —$(CH_2)_nC(R)_2CH(R)(C(O)OR^{})$ or —$(CH_2)_nC(R)_2CH(C(O)OR^{})_2$ can be represented as follows:

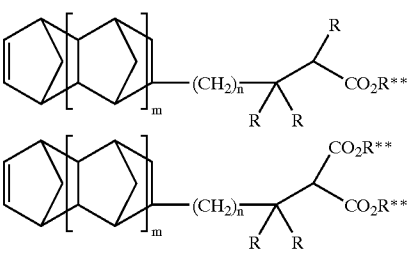

wherein m is as defined above and n is an integer from 0 to 10.

It should be apparent to those skilled in the art that any photoacid cleavable moiety is suitable in the practice of the invention so long as the polymerization reaction is not substantially inhibited by same.

The preferred acid labile group is a protected organic ester group in which the protecting or blocking group undergoes a cleavage reaction in the presence of an acid. Tertiary butyl esters of carboxylic acids are especially preferred.

The repeating units set forth under Formula II below contain a pendant group containing a protected hydroxyl moiety. By hydroxyl moiety is meant any functionality. that contains a hydroxyl group. For brevity the protected moiety can also be referred to as a protected-oxy group. The term protected-oxy refers to an oxygen atom that has been protected from undesired reactions. Representative hydroxyl containing functionalities include, for example, alcohols, carboxylic acids, and phenols. By protected hydroxyl moiety means the hydrogen atom on the oxygen atom in the hydroxyl moiety is temporarily replaced by a protecting group. The protecting group serves to protect the functional group from undesired side reactions or to block its undesired reaction with other functional groups or with the catalysts used to polymerize the base polymer. Repeating units containing pendant protected hydroxyl moieties are represented as follows:

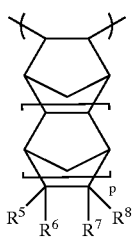

II wherein $R^5$ to $R^8$ independently represent hydrogen, linear and branched ($C_1$ to $C_{20}$) alkyl, —$(CH_2)_nC(O)OR$, —$(CH_2)_nOR$, —$(CH_2)_nOC(O)R$, —$(CH_2)_nC(O)R$, —$(CH_2)_nOC(O)OR$, wherein R is linear or branched ($C_1$ to $C_{10}$) alkyl. At least one of $R^5$ to $R^8$ is selected from a protected group represented by —$(CH_2)_nOG$, —$(CH_2)_nC(O)OG'$ and —$(CH_2)_n$—($C_6$ to $C_{14}$)aryl—OG. Representative aryl groups are phenyl, naphthyl, and anthracenyl. When the aryl group is phenyl the hydroxyl protected substituents can be represented as follows:

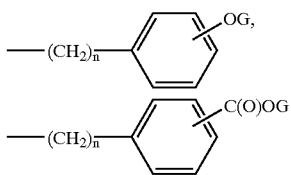

wherein n is an integer from 0 to 10, preferably, 0 to 5; p is an integer from 0 to 5, preferably 0 or 1; and G is a protecting group selected from a substituent of the formula —$Si(R^{15})_3$ or —$C(O)CH_3$ wherein $R^{15}$ independently represents linear and branched ($C_1$ to $C_{10}$) alkyl, aryl such as phenyl, aralkyl such as phenyl substituted with linear or branched ($C_1$ to $C_5$) alkyl groups. G' represents G or —$C(O)CH_3$. Representative silyl groups include trimethylsilyl, triethylsilyl, triisopropylsilyl, dimethylisopropylsilyl, diethylisopropylsilyl, dimethylhexylsilyl, dimethylphenylsilyl, t-butyldimethylsilyl, t-butyldiphenylsilyl, di-t-butylmethylsilyl, tribenzylsilyl, tri-p-xylylsilyl, triphenylsilyl, and diphenylmethylsilyl. Preferred protecting groups include trialkylsilyl with trimethylsilyl being the most preferred.

Optionally, the base polymer of the present invention can contain a repeating unit selected from Formula III below:

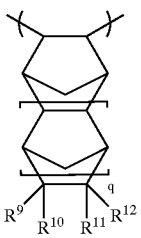

III wherein $R^9$ to $R^{12}$ independently represent hydrogen, linear or branched ($C_1$ to $C_{10}$) alkyl, or a substituent selected from the group: —$(A)_n$—$C(O)OR"$, —$(A)_n$—$OR"$, —$(A)_n$—$OC(O)R"$, —$(A)_n$—$OC(O)OR"$, —$(A)_n$—$C(O)R"$, —$(A)_n$—$OC(O)C(O)OR"$, —$(A)_n$—$O$—$A'$—$C(O)OR"$, —$(A)_n$—$OC(O)$—$A'$—$C(O)OR"$, —$(A)_n$—$C(O)O$—$A'$—$C(O)OR"$, —$(A)_n$—$C(O)$—$A'$—$OR"$, —$(A)_n$—$C(O)O$—$A'$—$OC(O)OR"$, —$(A)_n$—$C(O)O$—$A'$—$O$—$A'$—$C(O)OR"$, —$(A)_n$—$C(O)O$—$A'$—$OC(O)C(O)OR"$, —$(A)_n$—$C(R')_2CH(R')(C(O)OR')$, and —$(A)_n$—$C(R')_2CH(C(O)OR')_2$; and q is an integer from 0 to 5, preferably, 0 or 1. The moieties A and A' independently represent a divalent bridging or spacer radical selected from divalent hydrocarbon radicals, divalent cyclic hydrocarbon radicals, divalent oxygen containing radicals, and divalent cyclic ethers and cyclic diethers, and n is an integer 0 or 1. When n is 0 it should be apparent that A represents a single covalent bond. By divalent is meant that a free valence at each terminal end of the radical are attached to two distinct groups. The divalent hydrocarbon radicals can be represented by the formula —$(C_dH_{2d})$— where d represents the number of carbon atoms in the alkylene chain and is an integer from 1 to 10. The divalent hydrocarbon radicals are preferably selected from linear and branched ($C_1$ to $C_{10}$) alkylene such as methylene, ethylene, propylene, butylene, pentylene, hexylene, heptylene, octylene, nonylene, and decylene. When branched alkylene radicals are contemplated, it is to be understood that a hydrogen atom in the linear alkylene chain is replaced with a linear or branched ($C_1$ to $C_5$) alkyl group.

The divalent cyclic hydrocarbon radicals include substituted and unsubstituted ($C_3$ to $C_8$) cycloaliphatic moieties represented by the formula:

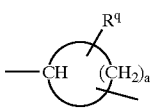

wherein a is an integer from 2 to 7 and $R^q$ when present represents linear and branched ($C_2$ to $C_{10}$) alkyl groups. Preferred divalent cycloalkylene radicals include cyclopentylene and cyclohexylene moieties represented by the following structures:

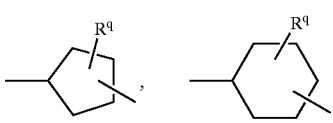

wherein $R^q$ is defined above.

Preferred divalent cyclic ethers and diethers are represented by the structures:

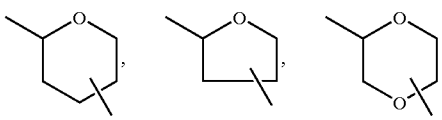

The divalent oxygen containing radicals include ($C_2$ to $C_{10}$) alkylene ethers and polyethers. By ($C_2$ to $C_{10}$) alkylene ether is meant that the total number of carbon atoms in the divalent ether moiety must at least be 2 and can not exceed 10. The divalent alkylene ethers are represented by the formula -alkylene-O-alkylene- wherein each of the alkylene groups that are bonded to the oxygen atom can be the same or different and are selected from methylene, ethylene, propylene, butylene, pentylene, hexylene, heptylene, octylene, and nonylene. The simplest divalent alkylene ether of the series is the radical —$CH_2$—O—$CH_2$—. Preferred polyether moieties include divalent radicals of the formula:

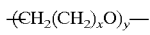

wherein x is an integer from 1 to 5 and y is an integer from 2 to 50 with the proviso that the terminal oxygen atom on the polyether spacer moiety can not be directly linked to a terminal oxygen atom on an adjacent group to form a peroxide linkage. In other words, peroxide linkages (i.e., —O—O—) are not contemplated when polyether spacers are linked to any of the terminal oxygen containing substituent groups set forth under $R^9$ to $R^{12}$ above. $R^9$ and $R^{12}$ can be taken together with the ring carbon atoms to which they are attached to represent a cyclic anhydride group as shown below:

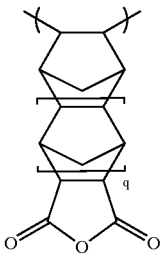

wherein q is defined as above. R" independently represents, linear and branched ($C_1$ to $C_{10}$) alkyl, linear and branched ($C_1$ to $C_{10}$) alkoxyalkylene, polyethers, monocyclic and polycyclic ($C_4$ to $C_{20}$) cycloaliphatic moieties, cyclic ethers, cyclic ketones, and cyclic esters (lactones). By ($C_1$ to $C_{10}$) alkoxyalkylene is meant that a terminal alkyl group is linked through an ether oxygen atom to an alkylene moiety. The radical is a hydrocarbon based ether moiety that can be generically represented as -alkylene-O-alkyl wherein the alkylene and alkyl groups independently contain 1 to 10 carbon atoms each of which can be linear or branched. The polyether radical can be represented by the formula:

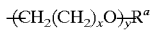

wherein x is an integer from 1 to 5, y is an integer from 2 to 50 and $R^a$ represents or linear and branched ($C_1$ to $C_{10}$) alkyl. Preferred polyether radicals include poly(ethylene oxide) and poly(propylene oxide).

Examples of monocyclic cycloaliphatic monocyclic moieties include cyclopropyl, cyclobutyl, cyclopentyl, cyclohexyl, and the like. Examples of cycloaliphatic polycyclic moieties include, norbornyl, adamantyl, tetrahydrodicyclopentadienyl (tricyclo[$5.2.1.0^{2,6}$] decanyl), and the like. Examples of cyclic ethers include tetrahydrofuranyl and tetrahydropyranyl moieties. An example of a cyclic ketone is a 3-oxocyclohexanonyl moiety.

The base polymer according to the present invention comprises repeating units set forth under Formulae I and II in optional combination with repeating units set forth under Formula III. Base polymers comprising repeating units of Formula I and Formula III are also contemplated within the scope of this invention. Accordingly, the base polymers of the invention comprise the following repeating units:

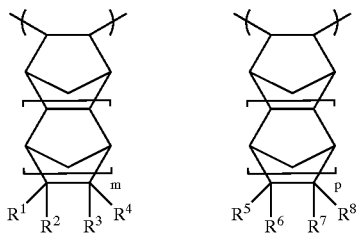

when the optional repeating units described under Formula III are included, the base polymers of the invention comprise the following repeating units:

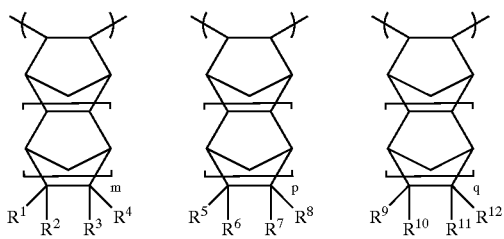

In the above described polymers $R^1$ to $R^{12}$, m, p, and q are as previously defined and at least one of $R^1$ to $R^4$ must be an acid labile group and at least one of $R^5$ to $R^8$ must be a protected hydroxyl containing moiety. The base polymers of the invention can comprise any combination of repeating units so long as pendant protected hydroxyl containing moieties and pendant acid labile groups are present on the polymer.

The base polymers of the present invention generally comprise about 5 to about 95 mole percent of polycyclic repeating units containing the pendant acid labile group, and about 95 to about 5 mole percent of polycyclic repeating units containing the pendant protected hydroxyl moiety. Optionally, the polymers of the invention can contain about 5 to about 50 mole percent of the repeating unit set forth under Formula III.

The base polymers of the present invention are preferably addition polymers comprising polycyclic repeating units that are connected to one another via 2,3-linkages that are formed across the double bond contained in the norbornene-type moiety of the prepolymerized polycyclic monomer.

The base polymers of the invention can be polymerized in the presence of a single or multi-component Group VIII transition metal catalyst system from the appropriately functionalized norbornene-type monomers as set forth under Formulae Ia, IIa and IIIa below:

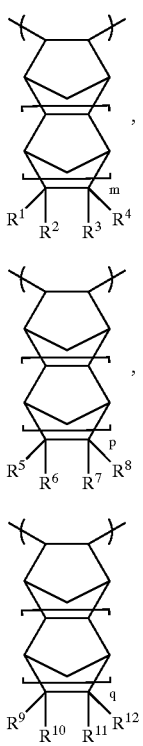

Ia

IIa

IIIa wherein $R^1$ to $R^{12}$, m, p, and q have been previously described.

An economical route for the preparation of the substituted polycyclic monomers of the invention relies on the Diels-Alder reaction in which cyclopentadiene (CPD) or substituted CPD is reacted with a suitably substituted dienophile at elevated temperatures to form a substituted polycyclic adduct generally shown by the following reaction scheme:

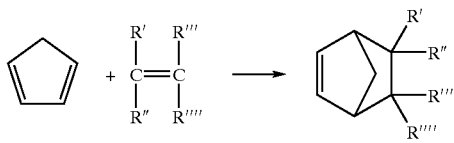

Other polycyclic adducts can be prepared by the thermal pyrolysis of dicyclopentadiene (DCPD) in the presence of a suitable dienophile. The reaction proceeds by the initial pyrolysis of DCPD to CPD followed by the Diels-Alder addition of CPD and the dienophile to give the adducts as shown below:

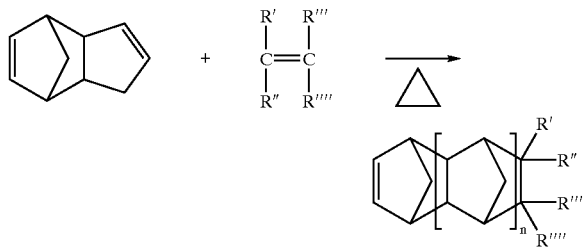

wherein R' to R"" independently represents the substituents defined under $R^1$ to $R^{12}$ in Formulae I, II, III, above.

For example the trimethylsilyl ester of norbornene can be prepared by the Diels-Alder reaction of cyclopentadiene with acryloxytrimethylsilane in accordance with the following reaction scheme:

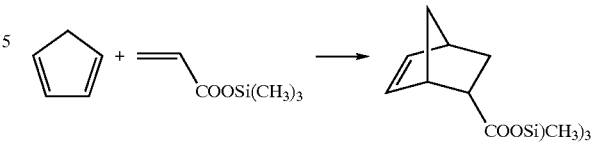

Catalysts and methods to polymerize these monomers are described in International Patent Application Publication No. WO97/33198 to The BFGoodrich Company, published on Jun. 12, 1997, the entire disclosure of which is hereby incorporated by reference.

A single component catalyst system useful in making polymers utilized in this invention is represented by the formula:

$$E_nNi(C_6F_5)_2$$

wherein n is 1 or 2 and E represents a neutral 2 electron donor ligand. When n is 1, E preferably is a π-arene ligand such as toluene, benzene, and mesitylene. When n is 2, E is preferably selected from diethylether, tetrahrydrofuran (THF), and dioxane. The ratio of monomer to catalyst in the reaction medium can range from about 5000:1 to about 50:1. The reaction can be run in a hydrocarbon solvent such as cyclohexane, toluene, and the like at a temperature range from about 0° C. to about 70° C., preferably 10° C. to about 50° C., and more preferably from about 20° C. to about 40° C. Preferred catalysts of the above formula are (toluene)bis (perfluorophenyl) nickel, (mesitylene)bis(perfluorophenyl) nickel, (benzene)bis(perfluorophenyl) nickel, bis (tetrahydrofuran)bis(perfluorophenyl) nickel and bis (dioxane)bis(perfluorophenyl) nickel.

An essential feature of the invention is that the hydroxyl containing moiety of the monomer set forth under Formula IIa be protected when these monomers are introduced into the polymerization reactor. Otherwise, the unprotected hydroxyl containing moiety would tend to react with the Group VIII metal catalyst, thereby leading to a loss of activity.

The protecting groups described under G above are introduced into the monomer by techniques well known in the art and are described, for example, in T. W. Green and P. G. M. Wuts, *Protective Groups In Organic Synthesis*, Second Edition, John Wiley & Sons. Inc., New York, 1991. Other protecting groups can be employed so long as they are easily introduced into the monomer, do not interact with the catalyst system so as to inhibit the polymerization reaction, are easily removed from the protected moiety, and do not attack the deprotected moiety. The protecting group should also be able to be selectively removed by deprotection reagents that do not attack the acid labile groups in the base polymer. In other words the protecting group should have a lower activation energy than the acid labile group.

Preferably the protecting group should also have a lower activation energy than the acid labile moiety to ensure that the protecting group is clipped while the acid labile group remains intact.

Following the synthesis of the base polymer containing the desired pendant protected hydroxyl containing moiety, the protected hydroxyl containing moiety is deprotected to yield the alcohol, carboxylic acid or phenol containing functionality. Removal of the protecting groups are well described in the art, for example, see *Protective Groups In Organic Synthesis*, supra. Representative deprotection reactions are set forth below:

Alcohols:

Repeating units containing pendant protected alcohol substituents (silyl ethers) can be deprotected via acid hydrolysis in the presence of tetrahydrofuran solvent as follows:

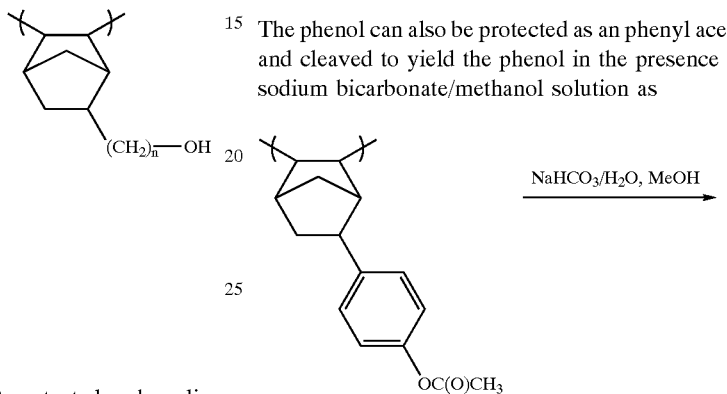

wherein n is an integer from 0 to 10.

Carboxylic Acids:

Repeating units containing pendant protected carboxylic acid (silyl esters) substituents can be deprotected via acid hydrolysis as described above or the base polymer containing the repeating unit can be precipitated in an aqueous methanol solution to undergo hydrolysis to the carboxylic acid functionality. A representative deprotection reaction is as follows:

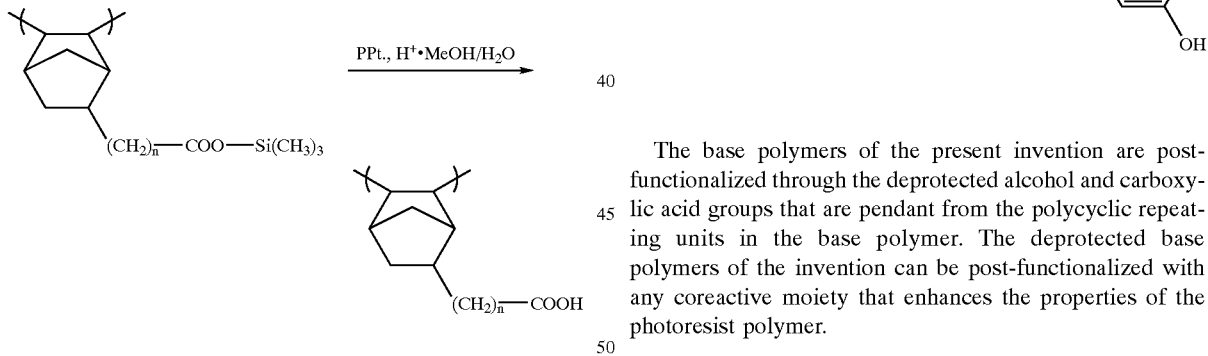

wherein n is an integer from 0 to 10. The acid containing base polymers so produced can be utilized for photoresist applications at this point or can be post-functionalized with a coreactive group as will be described below.

Phenols:

Repeating units containing pendant protected phenol groups (silyl ethers) can be deprotected by refluxing the base polymer containing same in an acidic methanol solution. Trimethylsilyl groups in silyl ether protected groups can be cleaved by mild acids and bases or in the presence of fluoride ion (tetraalkylammonium fluoride). The reaction scheme can be represented as follows:

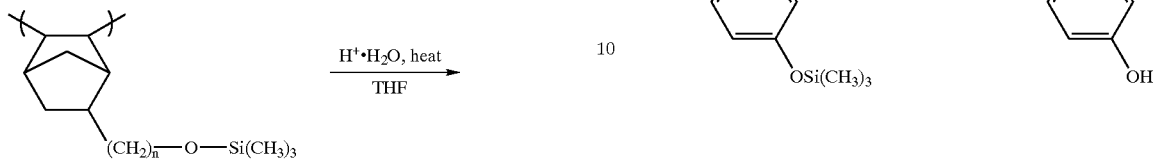

The phenol can also be protected as an phenyl acetate moiety and cleaved to yield the phenol in the presence of aqueous sodium bicarbonate/methanol solution as The base polymers of the present invention are post-functionalized through the deprotected alcohol and carboxylic acid groups that are pendant from the polycyclic repeating units in the base polymer. The deprotected base polymers of the invention can be post-functionalized with any coreactive moiety that enhances the properties of the photoresist polymer.

Base polymers containing pendant alcohol groups can be post-functionalized with succinic anhydride, isocyanates of the formula $R^{16}$—NCO, sulfonate esters of the formula: $R^{16}$—$SO_2$—O—$SO_2$—$R^{16}$ and coreactive moieties of the formula $R^{16}$—C(O)O(O)C—$R^{16}$ wherein in the above formulae $R^{16}$ is a linear or branched ($C_1$ to $C_{10}$) alkyl group, ($C_6$ to $C_{20}$) aryl, ($C_7$ to $C_{24}$) aralkyl, or a silyl group represented by the formula —$(CH)_n$—$Si(R^{19})_3$, wherein $R^{19}$ is a linear or branched ($C_1$ to $C_{10}$) alkyl group, ($C_6$ to $C_{20}$) aryl, ($C_7$ to $C_{24}$) aralkyl, and n is an integer from 0 to 10. As used here and throughout the specification by aralkyl is meant an aryl group with a linear or branched ($C_2$ to $C_{10}$) alkyl substituent(s). Representative aryl and aralkyl groups are phenyl, tolyl, xylyl, and the like. Representative reactions are set forth below:

1.

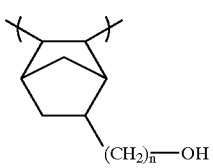 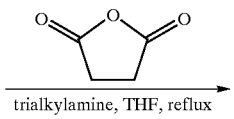

trialkylamine, THF, reflux

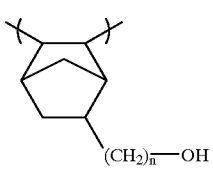

2.

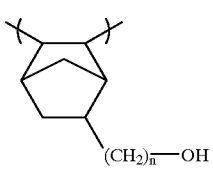 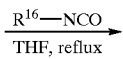

R$^{16}$—NCO
THF, reflux

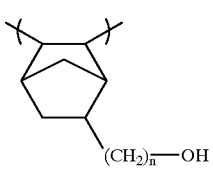

3.

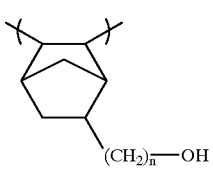 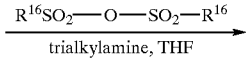

R$^{16}$SO$_2$—O—SO$_2$—R$^{16}$
trialkylamine, THF

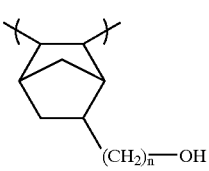

4.

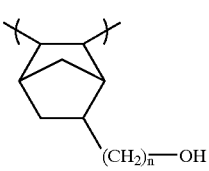 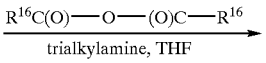

R$^{16}$C(O)—O—(O)C—R$^{16}$
trialkylamine, THF

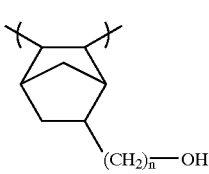

5.

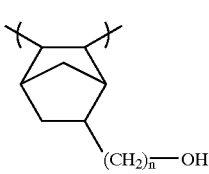 

CH$_3$C(O)O—⌬—C(O)Cl
trialkylamine, THF

-continued

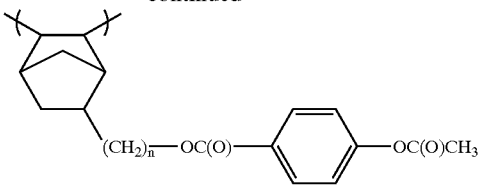

Base polymers containing pendant carboxylic acid groups can be post-functionalized with linear and branched acetals, cyclic acetals, orthocarbonates, and vinyl ethers that are coreactive with the carboxylic group. Suitable linear and branched acetal substituents include methoxymethyloxy, ethoxymethyloxy, n-propoxymethyloxy, n-butoxymethyloxy, phenoxymethyloxy, isopropoxymethyloxy, t-butoxymethyloxy, and trichloroethoxymethyloxy groups. Suitable cyclic acetal substituents include tetrahydrofuranyloxy and tetrahydropyranyloxy groups. Suitable orthocarbonate substituents include trimethoxymethyloxy, triethoxymethyloxy tri-n-propoxymethyloxy, and diethoxymethyloxy groups. Enolethers include vinyl ether, 1-propenyl ether, 1-butenyl ether, 1,3-butadienyl ether, and phenylvinyl ether. Representative coreactive moieties are set forth below:

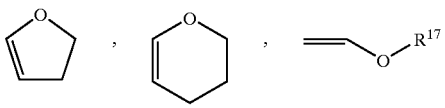

wherein R$^{17}$ represents linear or branched (C$_1$ to C$_{10}$) alkyl, (C$_2$ to C$_{10}$) alkenyl, or aryl.

The foregoing moieties are reacted with the desired base polymer comprising repeating units having the pendant carboxylic acid groups. The reaction is conducted in appropriate solvent and at a temperature conducive to effecting the reaction. A typical post-functionalization reaction scheme for the carboxylic acid moiety can be represented as follows:

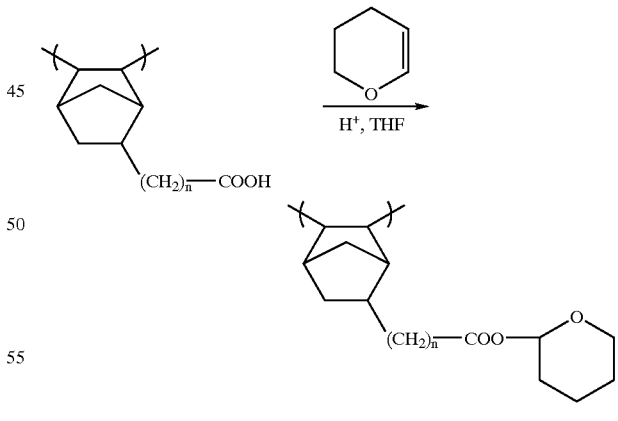

Base polymers comprising repeating units of Formula I and Formula III can be post-functionalized so long as the substituents on the polycyclic repeat unit of Formula III are suitable for post reaction and the post reaction conditions do not deleteriously affect the acid labile group on the Formula I corepeat unit. The following Formula III functional group wherein R$^9$ and R$^{12}$ taken with the carbon atoms to which they are attached form a cyclic anhydride has been found to be an excellent platform for post-functionalization reactions.

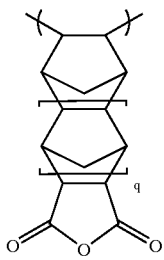

The cyclic anhydride functionality can be reacted with an amine, $R^{18}$—$NH^2$, or and alcohol to yield a difunctional acid/amide or difunctional acid/ester. Conversion of the anhydride functionality to the difunctional acid/amide is shown below:

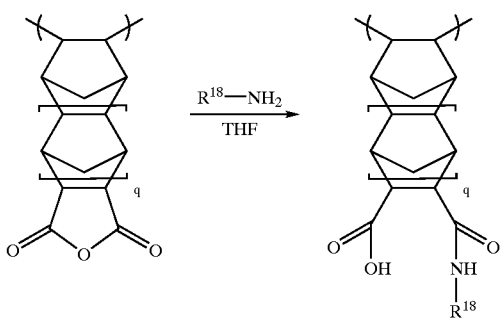

wherein $R^{18}$ is linear or branched ($C_1$ to $C_{10}$) alkyl, ($C_6$ to $C_{20}$) aryl or aralkyl. The difunctional repeating unit so obtained can be cyclized via a condensation reaction in an appropriate solvent to yield an imide functionality as shown below:

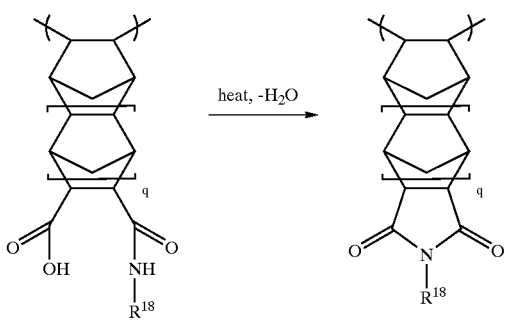

In addition to post-functionalizing desired alcohol and carboxylic acid containing base polymer compositions, it will be recognized that the post-functionalized polymer compositions of this invention can be further functionalized to introduce pendant substituents into the polymer backbone. For example, nitrile groups can be introduced into the polymer by reacting sulfonyl ester substituted polymers with a cyanide salt, e.g., sodium cyanide, or an organonitrile such as trimethylsilylnitrile in the presence of a halide salt to yield a polymer having nitrile substituted repeating units. The reaction can be written as follows:

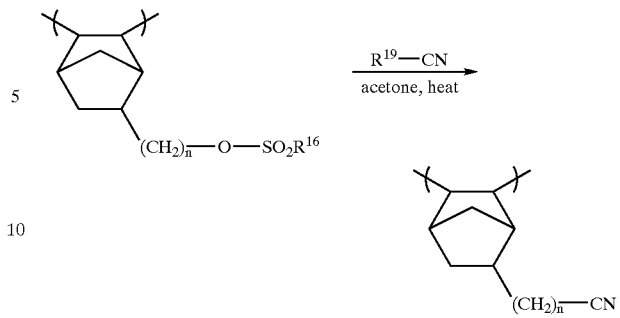

wherein $R^{19}$ is an organo group capable of being clipped by an halide salt such as sodium chloride, sodium fluoride and the like.

In another reaction the post-functionalized product of equation 5 above can be further reacted to clip the acetate substituent from the phenyl ring in the presence of an acidic methanol solution to obtain the corresponding phenol. The reaction is represented as follows:

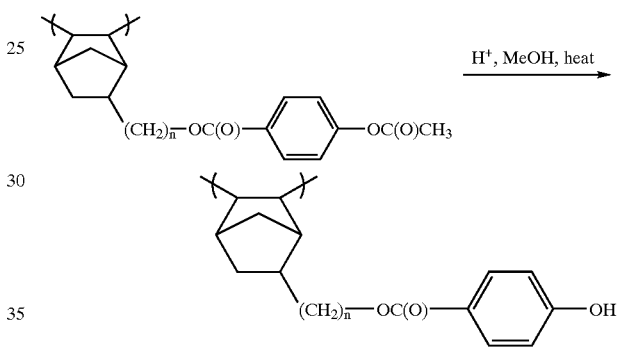

The foregoing post-functionalization reactions can be carried out by reacting the base polymer comprising repeating units having the pendant reactive moiety with the desired coreactive moiety in an appropriate solvent and at a temperature that induces the reaction but that does not unduly affect the reactants or desired product. Suitable solvents include aromatic hydrocarbon solvents such as benzene, chlorobenzene, xylene, and toluene; halohydrocarbon solvents such as dichloroethane, methylene chloride, and carbon tetrachloride; acid ethers such as ethyl acetate and butyl acetate; and ethers such as tetrahydrofuran (THF). The choice of solvent will depend on the reactants, and desired reaction conditions. Preferred solvents are ethers such as dioxane and THF. The base polymer or functionalized polymer to be reacted is dissolved in the desired solvent along with the appropriate coreactants. The reactants are then reacted with stirring in an appropriate temperature range to effect an efficient functionalization reaction. Reaction temperatures can range from about −100° C. to reflux temperatures depending on the nature of the reaction and solvent. Upon completion of the functionalization, the polymer is separated from the reaction medium and purified in accordance with conventional techniques. The degree of post-functionalization of the hydroxy containing moieties of the invention generally ranges from 10 to 100 mole percent, preferably 20 to 80 mole precent, and more preferably 30 to 70 mole percent.

The photoresist compositions of the present invention comprise the disclosed polycyclic compositions, a solvent, and an photosensitive acid generator (photoinitiator).

Optionally, a dissolution inhibitor can be added in an amount of up to about 20 weight % of the composition. A suitable dissolution inhibitor is t-butyl chelate (JV Crivello et al., Chemically Amplified Electron-Beam Photoresists, *Chem. Mater.*, 1996, 8, 376–381).

Upon exposure to radiation, the radiation sensitive acid generator generates a strong acid. Suitable photoacid generators include triflates (e.g., triphenylsulfonium triflate), pyrogallol (e.g., trimesylate of pyrogallol); onium salts such as triarylsulfonium and diaryliodium hexafluoroantimonates, hexafluoroarsenates, trifluoromethanesulfonates; esters of hydroxyimides, $\alpha,\alpha'$-bissulfonyl-diazomethanes, sulfonate esters of nitro-substituted benzyl alcohols and napthoquinone-4-diazides. Other suitable photoacid generators are disclosed in Reichmanis et al., *Chem. Mater.* 3, 395, (1991). Compositions containing triarylsulfonium or diariodonium salts are preferred because of their sensitivity to deep UV light (193 to 300 nm) and they give very high resolution images. Most preferred are the unsubstituted and symmetrically or unsymmetrically substituted diaryliodium or triarylsulfonium salts. The photoacid initiator component comprises about 1 to 100 w/w % to polymer. The preferred concentration range is 5 to 50 w/w %.

The photoresist compositions of the present invention optionally contain a sensitizer capable of sensitizing the photoacid initiator to longer wave lengths ranging from mid UV to visible light. Depending on the intended application, such sensitizers include polycyclic aromatics such as pyrene and perylene. The sensitization of photoacid initiators is well-known and is described in U.S. Pat. Nos. 4,250,053; 4,371,605; and 4,491,628 which are all incorporated herein by reference. The invention is not limited to a specific class of sensitizer or photoacid initiator.

The present invention also relates to a process for generating a positive tone resist image on a substrate comprising the steps of: (a) coating a substrate with a film comprising the positive tone resist composition of the present invention; (b) imagewise exposing the film to radiation; and (c) developing the image.

The first step involves coating the substrate with a film comprising the positive tone resist composition dissolved in a suitable solvent. Suitable substrates are comprised of silicon, ceramics, polymer or the like. Suitable solvents include propylene glycol methyl ether acetate (PGMEA), cyclohexanone, butyrolactate, ethyl lactate, and the like. The film can be coated on the substrate using art known techniques such as spin or spray coating, or doctor blading. Preferably, before the film has been exposed to radiation, the film is heated to an elevated temperature of about 90° C. to 150° C. for a short period of time of about 1 min. In the second step of the process, the film is imagewise exposed to radiation suitably electron beam or electromagnetic preferably electromagnetic radiation such as ultraviolet or x-ray, preferably ultraviolet radiation suitably at a wave length of about 193 to 514 nm preferably about 193 nm to 248 nm. Suitable radiation sources include mercury, mercury/xenon, and xenon lamps, argon fluoride and krypton fluoride lasers, x-ray or e-beam. The radiation is absorbed by the radiation-sensitive acid generator to produce free acid in the exposed area. The free acid catalyzes the cleavage of the acid labile pendant group of the copolymer which converts the copolymer from dissolution inhibitor to dissolution enhancer thereby increasing the solubility of the exposed resist composition in an aqueous base. Preferably, after the film has been exposed to radiation, the film is again heated to an elevated temperature of about 90° C. to 150° C. for a short period of time of about 1 minute.

The third step involves development of the positive tone image with a suitable solvent. Suitable solvents include aqueous base preferably an aqueous base without metal ions such as tetramethyl ammonium hydroxide or choline. The composition of the present invention provides positive images with high contrast and straight walls. Uniquely, the dissolution property of the composition of the present invention can be varied by simply varying the composition of the copolymer.

The present invention also relates to an integrated circuit assembly such as an integrated circuit chip, multichip module, or circuit board made by the process of the present invention. The integrated circuit assembly comprises a circuit formed on a substrate by the steps of: (a) coating a substrate with a film comprising the positive tone resist composition of the present invention; (b) imagewise exposing the film to radiation; (c) developing the image to expose the substrate; and (d) forming the circuit in the developed film on the substrate by art known techniques.

After the substrate has been exposed, circuit patterns can be formed in the exposed areas by coating the substrate with a conductive material such as conductive metals by art known techniques such as evaporation, sputtering, plating, chemical vapor deposition, or laser induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p or n doped circuit transistors. Other means for forming circuits are well known to those skilled in the art.

The following examples are detailed descriptions of methods of preparation and use of certain compositions of the present invention. The detailed preparations fall within the scope of, and serve to exemplify, the more generally described methods of preparation set forth above. The examples are presented for illustrative purposes only, and are not intended as a restriction on the scope of the invention.

EXAMPLE 1

Synthesis of t-Butylester of Norbornene/ trimethylsilyl Protected Norbornyl Alcohol Copolymer (50/50 Mole Ratio)

To a glass vial containing a stir bar was added under nitrogen atmosphere 17.6 g (0.089 mol) of trimethylsilyl protected norbornyl alcohol, 17.4 g (0.089 mol) of t-butyl ester of norbornene and 80 ml of toluene. To the reaction solution at room temperature was added via syringe a nickel catalyst solution (monomer to catalyst ratio of 200/1). The catalyst solution was prepared inside a dry box by adding 0.43 g (0.895 mmol) of $(CH_3C_6H_5)Ni(C_6F_5)_2$ in 15 ml of toluene. The polymerization was allowed to stir for 5 hours after which a solution of 0.255 g of 1,2-cyclohexanedione dioxime dissolved in 10 ml of acetone was added to chelate the Ni catalyst. The chelated Ni complex was observed to precipitate immediately. The solution was stirred overnight, filtered to remove the chelated complex and the filtrate was concentrated and poured into acetone to precipitate the polymer. The precipitated polymer was filtered, redissolved in tetrahydrofuran, and treated with Amberlyst® IR-131 (Rohm & Haas) a polystyrene/sulfonic acid based wet ion exchange resin. The resulting polymer solution was concentrated and precipitated into methanol. The polymer was filtered and dried overnight under vacuum. The yield of polymer was 15.3 g (44%). The polymer was further characterized using GPC, IR and NMR. The mol. wt. of the polymer was observed to be Mn=47,000, with a Mw of 84,000. IR clearly indicated the absence of any hydroxyl group. $^1$H NMR indicated the polymer composition was very close to the initial monomer feed ratio.

EXAMPLE 2

Synthesis of t-Butylester of Norbornene/norbornyl Alcohol Copolymer from t-Butylester of Norbornene/trimethylsilyl Protected Norbornyl Alcohol Copolymer (50/50 Mole Ratio)

To a glass vial containing a stir bar was added under nitrogen atmosphere 17.6 g (0.089 mol) of trimethylsilyl protected norbornyl alcohol, 17.4 g (0.089 mol) of t-butyl ester of norbornene and 80 ml of toluene. To the reaction solution at room temperature was added via syringe a nickel catalyst solution in a monomer to catalyst ratio of 200/1. The catalyst solution was prepared inside a dry box by adding 0.43 g (0.895 mmol) $(CH_3C_6H_5)$ $Ni(C_6F_5)_2$ in 15 ml of toluene. The polymerization was allowed to stir for 5 hours after which a solution of 0.255 g of 1,2-cyclohexanedione dioxime dissolved in 10 ml of acetone was added to chelate the Ni catalyst. The chelated Ni complex was observed to precipitate immediately. The solution was stirred overnight, filtered to remove the chelated complex, and the filtrate was concentrated and poured into methanol to precipitate the polymer. In order to remove the trimethylsilyl protecting group, a portion of the precipitated polymer was redissolved in tetrahydrofuran with a small amount of deionized water and treated with Amberlyst® IR-15 dry ion exchange resin at 50° C. for 5 hours. The resulting polymer solution was concentrated and precipitated into methanol. The precipitated polymer was filtered and dried overnight under vacuum. The overall yield of polymer was 21.4 g (61%). The polymer was further characterized using GPC, IR and NMR. The mol. wt. of the polymer was observed to be Mn=36,000, with a Mw of 68,000. IR clearly indicated the presence of hydroxyl groups. $^1$H NMR indicated the absence of trimethylsilyl groups and the polymer composition was very close to the initial monomer feed ratio.

EXAMPLE 3

Synthesis of Bicyclo[2.2.1]hept-5-ene-2-methyl Ethyl Carbonate/t-butylester of Norbornene/ norbornyl Alcohol Terpolymer from Bicyclo[2.2.1] hept-5-ene-2-methyl Ethyl Carbonate/t-butylester of Norbornene/trimethylsilyl Protected Norbornyl Alcohol Terpolymer (70/20/10 Ratio)

To a glass vial containing a stir bar was added under nitrogen atmosphere 11.5 g (0.061 mol) of bicyclo[2.2.1] hept-5-ene-2-methyl ethyl carbonate, 3.38 g (0.017 mol) of t-butyl ester of norbornene, 1.71 g (8.7 mmol) of trimethylsilyl protected norbornyl alcohol and 40 ml of toluene. To the reaction solution at room temperature was added via syringe a nickel catalyst solution in a monomer to catalyst ratio of 200/1. The catalyst solution was prepared inside a dry box by adding 0.211 g (0.435 mmol) of $(CH_3C_6H_5)Ni$ $(C_6F_5)_2$ in 5.0 ml of toluene. The polymerization was allowed to stir for 5 hours after which a solution of 0.123 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, a portion of the precipitated polymer was redissolved in tetrahydrofuran with 5 ml of deionized water and treated with Amberlyst® IR-15 dry ion exchange resin at 50° C. for 5 hours. The resulting polymer solution was concentrated and precipitated into methanol. The precipitated polymer was filtered and dried overnight under vacuum. The overall yield of polymer was 16.2 g (95%). The polymer was further characterized using GPC, IR and NMR. The mol. wt. of the polymer was observed to be Mn=45,000, with a Mw of 85,000. IR clearly indicated the presence of hydroxyl groups. $^1$H NMR indicated the absence of trimethylsilyl groups and the polymer composition was very close to the initial monomer feed ratio.

EXAMPLE 4

Synthesis of Bicyclo[2.2.1]hept-5-ene-2-methyl Ethyl Carbonate/t-butylester of Norbornene/ norbornyl Alcohol Terpolymer from Bicyclo[2.2.1] hept-5-ene-2-methyl Ethyl Carbonate/t-butylester of Norbornene/trimethylsilyl Protected Norbornyl Alcohol Terpolymer (60/30/10 Mole Ratio)

To a glass vial containing a stir bar was added under nitrogen atmosphere 10.25 g (0.052 mol) of bicyclo[2.2.1] hept-5-ene-2-methyl ethyl carbonate, 5.07 g (0.026 mol) of t-butyl ester of norbornene, 1.71 g (8.7 mmol) of trimethylsilyl protected norbornyl alcohol and 40 ml of toluene. To the reaction solution at room temperature was added via syringe a nickel catalyst solution in a monomer to catalyst ratio of 200/1. The catalyst solution was prepared inside a dry box by adding 0.211 g (0.435 mmol) of $(CH_3C_6H_5)Ni$ $(C_6F_5)_2$ in 5.0 ml of toluene. The polymerization was allowed to stir for 5 hours after which a solution of 0.123 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and poured into methanol to precipitate the polymer. In order to remove the trimethylsilyl protecting group, a portion of the precipitated polymer was redissolved in tetrahydrofuran with 5 ml of deionized water and treated with Amberlyst® IR-15 dry ion exchange resin at 50° C. for 5 hours. The resulting polymer solution was concentrated and precipitated into methanol. The polymer was filtered and dried overnight under vacuum. The overall yield of polymer was 15.3 g (90%). The polymer was further characterized using GPC, IR and NMR. The mol. wt. of the polymer was observed to be Mn=40,600 with a Mw of 83,000. IR clearly indicated the presence of hydroxyl groups. $^1$H NMR indicated the absence of trimethylsilyl groups and the polymer composition was very close to the initial monomer feed ratio.

EXAMPLE 5

Synthesis of Bicyclo[2.2.1]hept-5-ene-2-methyl Ethyl carbonate/t-butylester of Norbornene/ norbornyl Alcohol Terpolymer from Bicyclo[2.2.1] hept-5-ene-2-methyl Ethyl Carbonate/t-butylester of Norbornene/trimethylsilyl Protected Norbornyl Alcohol Terpolymer (50/40/10 Mole Ratio)

To a glass vial containing a stir bar was added under nitrogen atmosphere 25.1 g (0.128 mol) of bicyclo[2.2.1] hept-5-ene-2-methyl ethyl carbonate, 19.88 g (0.102 mol) of t-butyl ester of norbornene, 5.02 g (0.026 mol) of trimethylsilyl protected norbornyl alcohol and 40 ml of toluene. To the reaction solution at room temperature was added via syringe a nickel catalyst solution in a monomer to catalyst ratio of 200/1. The catalyst solution was prepared inside a dry box by adding 0.620 g (1.28 mmol) of $(CH_3C_6H_5)Ni(C_6F_5)_2$ in 5.0 ml of toluene. The polymerization was allowed to stir for 5 hours after which a solution of 0.3636 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, a portion of the precipitated polymer was redissolved in tetrahydrofuran with 5 ml of deionized water and treated with Amberlyst® IR-15 dry ion exchange resin at 50° C. for 5 hours. The resulting polymer solution was concentrated and precipitated into methanol. The polymer was filtered and dried overnight under vacuum. The overall yield of polymer was 35.9 g (72%). The polymer was further characterized using GPC, IR and NMR. The mol. wt. of the polymer was observed to be Mn=34,600 with a Mw of 68,000. IR clearly indicated the presence of hydroxyl groups. $^1$H NMR indicated the absence of trimethylsilyl groups and the polymer composition was very close to the initial monomer feed ratio.

EXAMPLE 6

Synthesis of Bicyclo[2.2.1]hept-5-ene-2-methyl Ethyl Carbonate/t-butylester of Norbornene/norbornyl Alcohol Terpolymer from Bicyclo[2.2.1]hept-5-ene-2-methyl Ethyl Carbonate/t-butylester of Norbornene/trimethylsilyl Protected Norbornyl Alcohol Terpolymer (50/35/15 Mole Ratio)

To a glass vial containing a stir bar was added under nitrogen atmosphere 12.5 g (0.638 mol) of bicyclo[2.2.1]hept-5-ene-2-methyl ethyl carbonate, 8.68 g (0.045 mol) of t-butyl ester of norbornene, 3.76 g (0.019 mol) of trimethylsilyl protected norbornyl alcohol and 40 ml of toluene. To the reaction solution at room temperature was added via syringe a nickel catalyst solution in a monomer to catalyst ratio of 200/1. The catalyst solution was prepared inside a dry box by adding 0.301 g (0.638 mmol) of $(CH_3C_6H_5)Ni(C_6F_5)_2$ in 5.0 ml of toluene. The polymerization was allowed to stir for 5 hours after which a solution of 0.181 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, a portion of the precipitated polymer was redissolved in tetrahydrofuran with 5 ml of deionized water and treated with Amberlyst® IR-15 dry ion exchange resin at 50° C. for 5 hours. The resulting polymer solution was concentrated and precipitated into methanol. The polymer was filtered and dried overnight under vacuum. The overall yield of polymer was 20.00 g (80%). The polymer was further characterized using GPC, IR and NMR. The mol. wt. of the polymer was observed to be Mn=34,300 with a Mw of 72,000. IR clearly indicated the presence of hydroxyl groups. $^1$H NMR indicated the absence of trimethylsilyl groups and the polymer composition was very close to the initial monomer feed ratio.

EXAMPLE 7

Synthesis of Bicyclo[2.2.1]hept-5-ene-2-methyl Ethyl Carbonate/t-butylester of Norbornene/norbornyl Alcohol Terpolymer from Bicyclo[2.2.1]hept-5-ene-2-methyl Ethyl Carbonate/t-butylester of Norbornene/trimethylsilyl Protected Norbornyl Alcohol Terpolymer (50/30/20 Mole Ratio)

To a glass vial containing a stir bar was added under nitrogen atmosphere 6.5 g (0.338 mol) of bicyclo[2.2.1]hept-5-ene-2-methyl ethyl carbonate, 3.86 g (0.019 mol) of t-butyl ester of norbornene, 2.6 g (0.013 mol) of trimethylsilyl protected norbornyl alcohol and 40 ml of toluene. To the reaction solution at room temperature was added via syringe a nickel catalyst solution in a monomer to catalyst ratio of 200/1. The catalyst solution was prepared inside a dry box by adding 0.301 g (0.638 mmol) of $(CH_3C_6H_5)Ni(C_6F_5)_2$ in 5.0 ml of toluene. The polymerization was allowed to stir for 5 hours after which a solution of 0.181 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, a portion of the precipitated polymer was redissolved in tetrahydrofuran with 5 ml of deionized water and treated with Amberlyst® IR-15 dry ion exchange resin at 50° C. for 5 hours. The resulting polymer solution was concentrated and precipitated into methanol. The precipitated polymer was filtered and dried overnight under vacuum. The overall yield of polymer was 21.23 g (85%). The polymer was further characterized using GPC, IR and NMR. The mol. wt. of the polymer was observed to be Mn=34,300 with a Mw of 72,000. IR clearly indicated the presence of hydroxyl groups. $^1$H NMR indicated the absence of trimethylsilyl groups and the polymer composition was very close to the initial monomer feed ratio.

EXAMPLE 8

Synthesis of Bicyclo[2.2.1]hept-5-ene-2-methyl Ethyl Carbonate/t-butylester of Norbornene/norbornyl Alcohol Terpolymer from Bicyclo[2.2.1]hept-5-ene-2-methyl Ethyl Carbonate/t-butylester of Norbornene/trimethylsilyl Protected Norbornyl Alcohol Terpolymer (50/25/25 Mole Ratio)

To a glass vial containing a stir bar was added under nitrogen atmosphere 12.5 g (0.638 mol) of bicyclo[2.2.1]hept-5-ene-2-methyl ethyl carbonate, 6.21 g (0.032 mol) of t-butyl ester of norbornene, 6.28 g (0.032 mol) of trimethylsilyl protected norbornyl alcohol and 62 ml of toluene. To the reaction solution at room temperature was added via syringe a nickel catalyst solution in a monomer to catalyst ratio of 200/1. The catalyst solution was prepared inside a dry box by adding 0.309 g (0.64 mmol) of $(CH_3C_6H_5)Ni(C_6F_5)_2$ in 5.0 ml of toluene. The polymerization was allowed to stir for 5 hours after which a solution of 0.182 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex and the filtrate was concentrated and finally poured into methanol to precipitate the polymer. In order to remove the trimethylsilyl protecting group, a portion of the precipitated polymer was redissolved in tetrahydrofuran with 5 ml of deionized water and treated with Amberlyst® IR-15 dry ion exchange resin at 50° C. for 5 hours. The resulting polymer solution was concentrated and precipitated into methanol. The precipitated polymer was filtered and dried overnight under vacuum. The overall yield of polymer was 16.6 g (66%). The polymer was further characterized using GPC, IR and NMR. The mol. wt. of the polymer was observed to be Mn=41,300 with a Mw of 75,000. IR clearly indicated the presence of hydroxyl groups. $^1$H NMR indicated the absence of trimethylsilyl groups and the polymer composition was very close to the initial monomer feed ratio.

EXAMPLE 9

Synthesis of Bicyclo[2.2.1]hept-5-ene-2-methyl Ethyl Carbonate/t-butylester of Norbornene/ norbornyl Alcohol Terpolymer from Bicyclo[2.2.1]hept-5-ene-2-methyl Ethyl Carbonate/t-butylester of Norbornene/trimethylsilyl Protected Norbornyl Alcohol Terpolymer (50/25/25 Mole Ratio)

To a glass vial containing a stir bar was added under nitrogen atmosphere 12.5 g (0.638 mol) of bicyclo[2.2.1]hept-5-ene-2-methyl ethyl carbonate, 6.21 g (0.032 mol) of t-butyl ester of norbornene, 6.28 g (0.032 mol) of trimethylsilyl protected norbornyl alcohol and 62 ml of toluene. To the reaction solution at room temperature was added via syringe a nickel catalyst solution in a monomer to catalyst ratio of 200/1. The catalyst solution was prepared inside a dry box by adding 0.309 g (0.64 mmol) of $(CH_3C_6H_5)Ni(C_6F_5)_2$ in 5.0 ml of toluene. The polymerization was allowed to stir for 5 hours after which a solution of 0.182 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, a portion of the precipitated polymer was redissolved in tetrahydrofuran with 5 ml of deionized water and treated with Amberlyst® IR-15 dry ion exchange resin at 50° C. for 5 hours. The resulting polymer solution was concentrated and precipitated into methanol. The precipitated polymer was filtered and dried overnight under vacuum. The overall yield of polymer was 16.6 g (66%). The polymer was further characterized using GPC, IR and NMR. The mol. wt. of the polymer was observed to be Mn=41,300 with a Mw of 75,000. IR clearly indicated the presence of hydroxyl groups. $^1$H NMR indicated the absence of trimethylsilyl groups and the polymer composition was very close to the initial monomer feed ratio.

EXAMPLE 10

Synthesis of Bicyclo[2.2.1]hept-5-ene-2-methyl Ethyl Carbonate/t-butylester of Norbornene/ norbornyl Alcohol Terpolymer from Bicyclo[2.2.1]hept-5-ene-2-methyl Ethyl Carbonate/t-butylester of Norbornene/trimethylsilyl Protected Norbornyl Alcohol Terpolymer (30/50/20 Mole Ratio)

To a glass vial containing a stir bar was added under nitrogen atmosphere 4.85 g (0.024 mol) of bicyclo[2.2.1]hept-5-ene-2-methyl ethyl carbonate, 8.0 g (0.041 mol) of t-butyl ester of norbornene, 3.23 g (0.016 mol) of trimethylsilyl protected norbornyl alcohol and 30 ml of toluene. To the reaction solution at room temperature was added via syringe a nickel catalyst solution in a monomer to catalyst ratio of 200/1. The catalyst solution was prepared inside a dry box by adding 0.199 g (0.412 mmol) of $(CH_3C_6H_5)Ni(C_6F_5)_2$ in 15 ml of toluene. The polymerization was allowed to stir for 5 hours after which a solution of 0.1 17 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, a portion of the precipitated polymer was redissolved in tetrahydrofuran with 5 ml of deionized water and treated with Amberlyst® IR-15 dry ion exchange resin at 50° C. for 5 hours. The resulting polymer solution was concentrated and precipitated into methanol. The precipitated polymer was filtered and dried overnight under vacuum. The overall yield of polymer was 9.7 g (60%). The polymer was further characterized using GPC, IR and NMR. The mol. wt. of the polymer was observed to be Mn=31,300 with a Mw of 65,000. IR clearly indicated the presence of hydroxyl groups. $^1$H NMR indicated the absence of trimethylsilyl groups and the polymer composition was very close to the initial monomer feed ratio.

EXAMPLE 11

Synthesis of Bicyclo[2.2.1]hept-5-ene-2-methyl Acetate/t-butylester of Norbornene/norbornyl Alcohol Terpolymer from Bicyclo[2.2.1]hept-5-ene-2-methyl Acetate/t-butylester of Norbornene/ trimethylsilyl Protected Norbornyl Alcohol Terpolymer (40/40/20 Mole Ratio)

To a glass vial containing a stir bar was added under nitrogen atmosphere 1.10 g (6.65 mmol) of bicyclo[2.2.1]hept-5-ene-2-methyl acetate, 1.30 g (6.7 mmol) of t-butyl ester of norbornene, and 0.60 g (3.08 mmol) of trimethylsilyl protected norbornyl alcohol. To the reaction solution at room temperature was added via syringe a nickel catalyst solution in a monomer to catalyst ratio of 200/1. The catalyst solution was prepared inside a dry box by adding 0.04 g (0.083 mmol) of $(CH_3C_6H_5)Ni(C_6F_5)_2$ in 7 ml of toluene. The polymerization was allowed to stir for 5 hours after which a solution of 0.024 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, a portion of the precipitated polymer was redissolved in tetrahydrofuran with 5 ml of deionized water and treated with Amberlyst® IR-15 dry ion exchange resin at 50 ° C. for 5 hours. The resulting polymer solution was concentrated and precipitated into methanol. The precipitated polymer was filtered and dried overnight under vacuum. The overall yield of polymer was 0.72 g (24%). The polymer was further characterized using GPC, IR and NMR. The mol. wt. of the polymer was observed to be Mn=19,000 with a Mw of 77,000. IR clearly indicated the presence of hydroxyl groups. $^1$H NMR indicated the absence of trimethylsilyl groups and the polymer composition was very close to the initial monomer feed ratio.

EXAMPLE 12

Synthesis of Bicyclo[2.2.1]hept-5-ene-2-methyl Ethyl Oxalate/t-butylester of Norbornene/norbornyl Alcohol Terpolymer from Bicyclo[2.2.1]hept-5-ene-2-methyl Ethyl Oxalate/t-butylester of Norbornene/ trimethylsilyl Protected Norbornyl Alcohol Terpolymer (70/20/10 Mole Ratio)

To a glass vial containing a stir bar was added under nitrogen atmosphere 16.02 g (0.071 mol) of bicyclo[2.2.1]

hept-5-ene-2-methyl ethyl oxalate, 3.97 g (0.02 mol) of t-butyl ester of norbornene, 2.00 g (0.01 mol) of trimethylsilyl protected norbornyl alcohol and 55 ml of toluene. To the reaction solution at room temperature was added via syringe a nickel catalyst solution in a monomer to catalyst ratio of 200/1. The catalyst solution was prepared inside a dry box by adding 0.247 g (0.51 mmol) of $(CH_3C_6H_5)Ni(C_6F_5)_2$ in 5 ml of toluene. The polymerization was allowed to stir for 5 hours after which a solution of 0.145 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, a portion of the precipitated polymer was redissolved in tetrahydrofuran with 5 ml of deionized water and treated with Amberlyst® IR-15 dry ion exchange resin at 50° C. for 5 hours. The resulting polymer solution was concentrated and precipitated into methanol. The precipitated polymer was filtered and dried overnight under vacuum. The overall yield of polymer was 20.3 g (92%). The polymer was further characterized using GPC, IR and NMR. The mol. wt. of the polymer was observed to be Mn=19,000 with a Mw of 77,000. IR clearly indicated the presence of hydroxyl groups. $^1H$ NMR indicated the absence of trimethylsilyl groups and the polymer composition was very close to the initial monomer feed ratio.

EXAMPLE 13

Synthesis of Ethyl Ester of Norbornene/norbornyl Alcohol Copolymer from Ethyl Ester of Norbornene/trimethylsilyl Protected Norbornyl Alcohol Terpolymer (70/20/10 Mole Ratio)

To a glass vial containing a stir bar was added under nitrogen atmosphere 16.05 g (0.02 mol) of ethyl ester of norbornene, 18.96 g (0.097 mol) of trimethylsilyl protected norbornyl alcohol and 90 ml of toluene. To the reaction solution at room temperature was added via syringe a nickel catalyst solution in a monomer to catalyst ratio of 200/1. The catalyst solution was prepared inside a dry box by adding 0.47 g (0.97 mmol) of $(CH_3C_6H_5)Ni(C_6F_5)_2$ in 5 ml of toluene. The polymerization was allowed to stir for 5 hours after which a solution of 0.275 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, a portion of the precipitated polymer was redissolved in tetrahydrofuran with 5 ml of deionized water and treated with Amberlyst® IR-I 5 dry ion exchange resin at 50° C. for 5 hours. The resulting polymer solution was concentrated and precipitated into methanol. The precipitated polymer was filtered and dried overnight under vacuum. The overall yield of polymer was 28.5 g (81%). The polymer was further characterized using GPC, IR and NMR. The mol. wt. of the polymer was observed to be Mn=49,000 with a Mw of 80,000. IR clearly indicated the presence of hydroxyl groups. $^1H$ NMR indicated the absence of trimethylsilyl groups and the polymer composition was very close to the initial monomer feed ratio.

EXAMPLE 14

Conversion of t-Butyl Ester of Norbornene/ norbornyl Alcohol Copolymer to t-Butyl Ester of Norbornene/succinic Acid Mono (Norbornyl Methyl)ester Copolymer Using Succinic Anhydride (50/50 Mole Ratio)

To a dry 3-neck 50 ml round bottom flask equipped with a reflux condenser and a thermometer was placed 0.5 g of the t-butyl ester of norbornene/norbornyl alcohol copolymer obtained from Example 2, followed by 0.014 g (0.14 mmol) of succinic anhydride, 10 ml of tetrahydrofuran and 4.2 μl (0.028 mmol) of 1,8-diazabicyclo[5.4.0]undec-7-ene. The mixture was refluxed for 3 hours and then was diluted with dimethylformamide (DMF) and precipitated into a dilute acetic acid solution. The precipitated polymer was washed with methanol, to remove any unreacted succinic anhydride, filtered and dried overnight under vacuum. The polymer was characterized using IR and NMR. The mol. wt. of the polymer was observed to be Mn=49,000 with a Mw of 80,000. Both IR and $^1H$ clearly indicated the presence of acid functionality group.

EXAMPLE 15

Conversion of Bicyclo[2.2.1]hept-5-ene-2-methyl Ethyl Carbonate/t-butyl Ester of Norbornene/ norbornyl Alcohol Terpolymer to Bicyclo[2.2.1] hept-5-ene-2-methyl Ethyl Carbonate/t-butyl Ester of Norbornene/succinic Acid Mono (Norbornyl Methyl)ester Copolymer Using Succinic Anhydride (50/30/20 Mole Ratio)

To a dry 3-neck 50 ml round bottom flask equipped with a reflux condenser and a thermometer was placed 0.5 g of the bicyclo[2.2.1]hept-5-ene-2-methyl ethyl carbonate/t-butyl ester of norbornene/norbornyl alcohol terpolymer obtained from Example 7, followed by 0.042 g (0.14 mmol) of succinic anhydride, 10 ml of tetrahydrofuran and 57 1 (0.379 mmol) of 1,8-diazabicyclo[5.4.0]undec-7-ene. The mixture was refluxed for 3 hours and then cooled. The polymer was precipitated into a dilute acetic acid solution. The precipitated polymer was washed with methanol to remove any unreacted succinic anhydride, filtered and dried overnight under vacuum. The polymer was further characterized using IR and NMR. IR clearly indicated the conversion of hydroxyl functionality to acid functionality.

EXAMPLE 16

Conversion of Bicyclo[2.2.1]hept-5-ene-2-methyl Ethyl Carbonate/t-butyl Ester of Norbornene/ norbornyl Alcohol Terpolymer to Bicyclo[2.2.1] hept-5-ene-2-methyl Ethyl Carbonate/t-butyl Ester of Norbornene/succinic Acid Mono (Norbornyl Methyl)ester Copolymer Using Succinic Anhydride (50/40/10 Mole Ratio)

To a dry 3-neck 50 ml round bottom flask equipped with a reflux condenser and a thermometer was placed 0.5 g of the bicyclo[2.2.1]hept-5-ene-2-methyl ethyl carbonate/t-butyl ester of norbornene/norbornyl alcohol terpolymer obtained from Example 5, followed by 0.73 g (7.3 mmol) of succinic anhydride, 35 ml of tetrahydrofuran and 325 1 (2.18 mmol) of 1,8-diazabicyclo[5.4.0]undec- 7-ene. The mixture was refluxed for 3 hours after which the solution was cooled, diluted with tetrahydrofuran, and the polymer was precipitated into a dilute acetic acid solution. The precipitated polymer was washed with methanol to remove any unreacted succinic anhydride, filtered and dried overnight under vacuum. The polymer was further characterized using IR and NMR. IR clearly indicated the conversion of hydroxyl functionality to acid functionality.

EXAMPLE 17

Conversion of Bicyclo[2.2.1]hept-5-ene-2-methyl Ethyl Carbonate/t-butyl Ester of Norbornene/ norbornyl Alcohol Terpolymer to Bicyclo[2.2.1] hept-5-ene-2-methyl Ethyl Carbonate/t-butyl Ester of Norbornene/succinic Acid Mono (Norbornyl Methyl)ester Copolymer Using Succinic Anhydride (50/35/15 Mole Ratio)

To a dry 3-neck 250 ml round bottom flask equipped with a reflux condenser and a thermometer was placed 16.6 g of the bicyclo[2.2.1]hept-5-ene-2-methyl ethyl carbonate/t-butyl ester of norbornene/norbornyl alcohol terpolymer obtained from Example 6, followed by 1.58 g (0.016 mol) of succinic anhydride, 100 ml of tetrahydrofuran and 710 1 (4.75 mmol) of 1,8-diazabicyclo[5.4.0]undec-7-ene. The mixture was refluxed for 3 hours after which the solution was cooled. diluted with tetrahydrofuran and the polymer was precipitated into a dilute acetic acid solution. The precipitated polymer was washed with methanol to remove any unreacted succinic anhydride, filtered and dried overnight under vacuum. The dried polymer was dissolved in tetrahydrofuran, and treated with Amberlyst® IR-15 dry ion exchange resin, filtered, concentrated and precipitated into methanol. The polymer was characterized using IR and NMR and GPC. IR clearly indicated the conversion of hydroxyl functionality to acid functionality. The mol. wt. of the polymer was measured to be Mn=32,000 and Mw=84,000.

EXAMPLE 18

Conversion of Bicyclo[2.2.1]hept-5-ene-2-methyl Ethyl Carbonate/t-butyl Ester of Norbornene/norbornyl Alcohol Terpolymer to Bicyclo[2.2.1]hept-5-ene-2-methyl Ethyl Carbonate/t-butyl Ester of Norbornene/succinic Acid Mono (Norbornyl Methyl)ester Copolymer Using Succinic Anhydride (50/25/25 Mole Ratio)

To a dry 3-neck 250 ml round bottom flask equipped with a reflux condenser and a thermometer was placed 14.5 g of the bicyclo[2.2.1]hept-5-ene-2-methyl ethyl carbonate/t-butyl ester of norbornene/norbornyl alcohol terpolymer obtained from Example 8, followed by 0.83 g (8.27 mmol) of succinic anhydride, 100 ml of tetrahydrofuran and 370 1(2.48 mmol) of 1,8-diazabicyclo[5.4.0]undec-7-ene. The mixture was refluxed for 3 hours after which the solution was cooled, diluted with dimethylformamide, and the polymer was precipitated into a dilute acetic acid solution. The precipitated polymer was washed with methanol to remove any unreacted succinic anhydride and dried overnight under vacuum. The dried polymer was dissolved in tetrahydrofuran, and treated with Amberlyst® IR-15 dry ion exchange resin, filtered, concentrated, and precipitated into methanol. The polymer was further characterized using IR and NMR and GPC. IR clearly indicated the conversion of hydroxyl functionality to acid functionality. The mol. wt. of the polymer was measure to be Mn=43,000 and Mw=86,000.

EXAMPLE 19

Conversion of Bicyclo[2.2.1]hept-5-ene-2-methyl Ethyl Oxalate/t-butyl Ester of Norbornene/norbornyl Alcohol Terpolymer to Bicyclo[2.2.1]hept-5-ene-2-methyl Ethyl Oxalate/t-butyl Ester of Norbornene/succinic Acid Mono (Norbornyl Methyl)ester Copolymer Using Succinic Anhydride (50/25/25 Mole Ratio)

To a dry 3-neck 250 ml round bottom flask equipped with a reflux condenser and a thermometer was placed 16.0 g of the bicyclo[2.2.1]hept-5-ene- 2-methyl ethyl oxalate/t-butyl ester of norbornene/norbornyl alcohol terpolymer obtained from Example 12, followed by 2.0 g (0.02 mol) of succinic anhydride, 100 ml of tetrahydrofuran and 897 1 (6.0 mmol) of 1,8-diazabicyclo[5.4.0]undec-7-ene. The mixture was refluxed for 3 hours after which the solution was cooled, and the polymer was precipitated into a dilute acetic acid solution. The precipitated polymer was washed with methanol, to remove any unreacted succinic anhydride, filtered, and dried overnight under vacuum. The dried polymer was dissolved in tetrahydrofuran, and treated with Amberlyst® IR-15 dry ion exchange resin, filtered, concentrated, and precipitated into methanol. The polymer was characterized using IR and NMR and GPC. IR clearly indicated the conversion of hydroxyl functionality to acid functionality. The mol. wt. of the polymer was measure to be Mn=68,000 and Mw=149,000.

EXAMPLE 20

Synthesis of Bicyclo[2.2.1]hept-5-ene-2-methyl Ethyl Oxalate/t-butylester of Norbornene/norbornyl Carboxylic Acid Terpolymer from Terpolymer of Bicyclo[2.2.1]hept-5-ene-2-methyl Ethyl Oxalate/t-butylester of Norbornene/trimethylsilyl Ester of Norbornene (50/40/10 Mole Ratio)

To a glass vial containing a stir bar was added under nitrogen atmosphere 14.00 g (0.063 mol) of bicyclo[2.2.1]hept-5-ene-2-methyl ethyl oxalate, 9.70 g (0.05 mol) of t-butyl ester of norbornene, 2.63 g (0.013 mol) of trimethylsilyl ester of norbornene and 65 ml of toluene. To the reaction solution at room temperature was added via syringe a nickel catalyst solution in a monomer to catalyst ratio of 200/1. The catalyst solution was prepared inside a dry box by adding 0.303 g (0.62 mmol) of $(CH_3C_6H_5)Ni(C_6F_5)_2$ in 5 ml of toluene. The polymerization was allowed to stir for 5 hours after which a solution of 0.178 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, the precipitated polymer was redissolved in tetrahydrofuran and treated with Amberlyst® IR-15 dry ion exchange resin at 50° C. for 5 hours. The resulting polymer solution was filtered, concentrated, and precipitated into methanol. The precipitated polymer was filtered and dried overnight under vacuum. The overall yield of polymer was 13.4 g (51%). The polymer was further characterized using GPC, IR and NMR. The mol. wt. of the polymer was observed to be Mn=33,000 with a Mw of 85,000. IR clearly indicated the presence of acid functionality. $^1H$ NMR indicated the absence of trimethylsilyl groups and the polymer composition was very close to the initial monomer feed ratio.

EXAMPLE 21

Synthesis of Bicyclo[2.2.1]hept-5-ene-2-methyl Ethyl Oxalate/norbornyl Carboxylic Acid Copolymer from Copolymer of Bicyclo[2.2.1]hept-5-ene-2-methyl Ethyl Oxalate/trimethylsilyl Ester of Norbornene (50/50 Mole Ratio)

To a glass vial containing a stir bar was added under nitrogen atmosphere 1.03 g (4.6 mmol) of bicyclo[2.2.1]hept-5-ene-2-methyl ethyl oxalate, 0.962 g (4.57 mmol) of trimethylsilyl ester of norbornene, followed by 5 ml of cyclohexane and 1 ml of ethyl acetate. To the reaction solution at room temperature was added via syringe a nickel catalyst solution in a monomer to catalyst ratio of 200/1. The catalyst solution was prepared inside a dry box by adding 0.022 g (0.046 mmol) of $(CH_3C_6H_5)Ni(C_6F_5)_2$ in 5 ml of toluene. The polymerization was allowed to stir for 5 hours and the solution was poured into methanol to precipitate the polymer. In order to remove the trimethylsilyl protecting group, the precipitated polymer was redissolved in tetrahydrofuran and treated with Amberlyst® IR-15 dry ion exchange resin at 50° C. for 5 hours. The overall yield of polymer was 0.64 g (32%). The polymer was characterized using GPC, IR and NMR. The mol. wt of the polymer was observed to be Mn=49,000 with a Mw of 142,000. IR clearly indicated the presence of acid functionality and the polymer composition was very close to the initial monomer feed ratio via $^1$H NMR.

EXAMPLE 22

Synthesis of Bicyclo[2.2.1]hept-5-ene-2-methyl Ethyl Carbonate/t-butylester of Norbornene/ norbornyl Carboxylic Acid Terpolymer from Terpolymer of Bicyclo[2.2.1]hept-5-ene-2-methyl Ethyl Carbonate/t-butylester of Norbornene/ trimethylsilyl Ester of Norbornene (50/40/10 Mole Ratio)

To a glass vial containing a stir bar was added under nitrogen atmosphere 21.00 g (0.11 mol) of bicyclo[2.2.1] hept-5-ene-2-methyl ethyl carbonate, 16.6 g (0.085 mol) of t-butyl ester of norbornene, 4.5 g (0.021 mol) of trimethylsilyl ester of norbornene and 430 ml of toluene. To the reaction solution at room temperature was added via syringe a nickel catalyst solution in a monomer to catalyst ratio of 100/1. The catalyst solution was prepared inside a dry box by adding 1.038 g (2.14 mmol) of $(CH_3C_6H_5)Ni(C_6F_5)_2$ in 10 ml of toluene. The polymerization was allowed to stir for 5 hours after which a solution of 0.61 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex and the filtrate was concentrated and finally poured into methanol to precipitate the polymer. In order to remove the trimethylsilyl protecting group, the precipitated polymer was redissolved in tetrahydrofuran and treated with Amberlyst® IR-15 dry ion exchange resin at 50° C. for 5 hours. The resulting polymer solution was concentrated and precipitated into a 1N acetic acid/methanol solution: The resulting polymer was filtered and dried overnight under vacuum. The overall yield of polymer was 31 g (75%). The polymer was further characterized using GPC, IR and NMR. The mol. wt. of the polymer was observed to be Mn=18,000 with a Mw of 36,000. IR clearly indicated the presence of acid functionality. $^1$H NMR indicated the absence of trimethylsilyl groups and the polymer composition was very close to the initial monomer feed ratio.

EXAMPLE 23

Synthesis of Bicyclo[2.2.1]hept-5-ene-2-methyl Ethyl Carbonate/t-butylester of Norbornene/ norbornyl Carboxylic Acid Terpolymer from Terpolymer of Bicyclo[2.2.1]hept-5-ene-2-methyl Ethyl Carbonate/t-butylester of Norbornene/ trimethylsilyl Ester of Norbornene (40/40/20 Mole Ratio)

To a glass vial containing a stir bar was added under nitrogen atmosphere 17.94 g (0.191 mol) of bicyclo[2.2.1] hept-5-ene-2-methyl ethyl carbonate, 17.76 g (0.091 mol) of t-butyl ester of norbornene, 9.6 g (0.046 mol) of trimethylsilyl ester of norbornene and 288 ml of toluene. To the reaction solution at room temperature was added via syringe a nickel catalyst solution in a monomer to catalyst ratio of 100/1. The catalyst solution was prepared inside a dry box by adding 1.108 g (2.28 mmol) of $(CH_3C_6H_5)Ni(C_6F_5)_2$ in 10 ml of toluene. The polymerization was allowed to stir for 5 hours after which a solution of 0.65 g of 1,2-cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, the precipitated polymer was redissolved in tetrahydrofuran and treated with Amberlyst® IR-15 dry ion exchange resin at 50° C. for 5 hours. The resulting polymer solution was filtered, concentrated, and precipitated into hexane. The precipitated polymer was filtered and dried overnight under vacuum. The overall yield of polymer was 29 g (64%). The polymer was further characterized using GPC, IR and NMR. The mol. wt. of the polymer was observed to be Mn=17,000 with a Mw of 33,700. IR clearly indicated the presence of acid functionality. $^1$H NMR indicated the absence of trimethylsilyl groups and the polymer composition was very close to the initial monomer feed ratio.

EXAMPLE 24

Synthesis of Bicyclo[2.2.1]hept-5-ene-2-methyl Ethyl Carbonate/t-butylester of Norbornene/ norbornyl Carboxylic Acid Terpolymer from Terpolymer of Bicyclo[2.2.1]hept-5-ene-2-methyl Ethyl Carbonate/t-butylester of Norbornene/ trimethylsilyl Ester of Norbornene (50/25/25 Mole Ratio To a glass vial containing a stir bar was added under nitrogen atmosphere 19.74 g (0.1 mol) of bicyclo[2.2.1] hept-5-ene-2-methyl ethyl carbonate, 9.75 g (0.501 mol) of t-butyl ester of norbornene, 10.56 g (0.050 mol) of trimethylsilyl ester of norbornene and 253 ml of toluene. To the reaction solution at room temperature was added via syringe a nickel catalyst solution in a monomer to catalyst ratio of 100/1. The catalyst solution was prepared inside a dry box by adding 0.973 g (2.01 mmol) of$(CH_3C_6H_5)Ni(C_6F_5)_2$ in 10 ml of toluene. The polymerization was allowed to stir for 5 hours after which the polymer solution was treated with Amberlite® IRC-718 (Rohm & Haas) imidoacetic acid based chelating resin, followed by Amberlyst® IR-15 dry ion exchange resin at 50° C. for 5 hours. The resulting polymer solution was filtered, concentrated, and precipitated into hexane. The precipitated polymer was filtered and dried overnight under vacuum. The overall yield of polymer was 27.6 g (68%). The polymer was characterized using GPC. IR and NMR. The mol. wt. of the polymer was observed to be Mn=19,000 with a Mw of 41,700. IR clearly indicated the presence of acid functionality. $^1$H NMR indicated the absence of trimethylsilyl groups and the polymer composition was very close to the initial monomer feed ratio.

EXAMPLE 25

Synthesis of Bicyclo[2.2.1]hept-5-ene-2-methyl Ethyl Carbonate/t-butylester of Norbornene/ norbornyl Carboxylic Acid Terpolymer from Terpolymer of Bicyclo[2.2.1]hept-5-ene-2-methyl Ethyl Carbonate/t-butylester of Norbornene/ trimethylsilyl Ester of Norbornene (50/35/15 Mole Ratio)

To a glass vial containing a stir bar was added under nitrogen atmosphere 21.34 g (0.11 mol) of bicyclo[2.2.1]

hept-5-ene-2-methyl ethyl carbonate, 14.8 g (0.076 mol) of t-butyl ester of norbornene, 6.86 g (0.033 mol) of trimethylsilyl ester of norbornene and 273 ml of toluene. To the reaction solution at room temperature was added via syringe a nickel catalyst solution in a monomer to catalyst ratio of 100/1. The catalyst solution was prepared inside a dry box by adding 1.055 (2.17 mmol) of $(CH_3C_6H_5)Ni(C_6F_5)_2$ in 10 ml of toluene. The polymerization was allowed to stir for 5 hours after which the polymer solution was treated with Amberlite® IRC-718 chelating resin, followed by Amberlyst® IR-15 dry ion exchange resin at 50° C. for 5 hours. The resulting polymer solution was filtered, concentrated. and precipitated into hexane. The precipitated polymer was filtered and dried overnight under vacuum. The overall yield of polymer was 31.6 g (74%). The polymer was further characterized using GPC, IR and NMR. The mol. wt. of the polymer was observed to be Mn=19,000 with a Mw of 40,000. IR clearly indicated the presence of acid functionality. $^1H$ NMR indicated the absence of trimethylsilyl groups and the polymer composition was very close to the initial monomer feed ratio.

EXAMPLE 26

Synthesis of Bicyclo[2.2.1]hept-5-ene-2-methyl Ethyl Carbonate/t-butylester of Norbornene/ norbornyl Carboxylic Acid/ethyl Ester of Tetracyclododecene Tetrapolymer from Tetrapolymer of Bicyclo[2.2.1]hept-5-ene-2-methyl Ethyl Carbonate/t-butylester of Norbornene/ trimethylsilyl Ester of Norbornene/ethyl Ester of Tetracyclododecene (25/35/15/25 Mole Ratio)

To a glass vial containing a stir bar was added under nitrogen atmosphere 10.68 g (0.052 mol) of bicyclo[2.2.1] hept-5-ene-2-methyl ethyl carbonate, 12.64 g (0.054 mol) ethyl ester of tetracyclododecene, 14.08 g (0.076 mol) of t-butyl ester of norbornene, 6.86 g (0.033 mol) of trimethylsilyl ester of norbornene and 110 ml of toluene. To the reaction solution at room temperature was added via syringe a nickel catalyst solution in a monomer to catalyst ratio of 100/1. The catalyst solution was prepared inside a dry box by adding 1.055 g (2.17 mmol) of $(CH_3C_6H_5)Ni(C_6F_5)_2$ in 10 ml of toluene. The polymerization was allowed to stir for 5 hours after which the polymer solution was treated with Amberlite® IRC-718 chelating resin, followed by Amberlyst® IR-15 dry ion exchange resin at 50° C. for 5 hours. The resulting polymer solution was filtered, concentrated, and precipitated into hexane. The precipitated polymer was filtered and dried overnight under vacuum. The overall yield of polymer was 27.9 g (62%). The polymer was further characterized using GPC, IR and NMR. The mol. wt. of the polymer was observed to be Mn=12,000 with a Mw of 26,000. IR clearly indicated the presence of acid functionality. $^1H$ NMR indicated the absence of trimethylsilyl groups and the polymer composition was very close to the initial monomer feed ratio.

EXAMPLE 27

Synthesis of Bicyclo[2.2.1]hept-5-ene-2-methyl Ethyl Carbonate/t-butylester of Norbornene/ norbornyl Carboxylic Acid/ethyl Ester of Tetracyclododecene Tetrapolymer from Tetrapolymer of Bicyclo[2.2.1]hept-5-ene-2-methyl Ethyl Carbonate/t-butylester of Norbornene/ trimethylsilyl Ester of Norbornene/ethyl Ester of Tetracyclododecene (25/25/25/25 Mole Ratio)

To a glass vial containing a stir bar was added under nitrogen atmosphere 11.78 g (0.06 mol) of bicyclo[2.2.1] hept-5-ene-2-methyl ethyl carbonate, 13.94 g (0.06 mol) ethyl ester of tetracyclododecene, 11.66 g (0.06 mol) of t-butyl ester of norbornene, 12.6 g (0.06 mol) of trimethylsilyl ester of norbornene and 110 ml of toluene. To the reaction solution at room temperature was added via syringe a nickel catalyst solution in a monomer to catalyst ratio of 100/1. The catalyst solution was prepared inside a dry box by adding 1.16 g (2.17 mmol) of $(CH_3C_6H_5)Ni(C_6F_5)_2$ in 10 ml of toluene. The polymerization was allowed to stir for 5 hours after which the polymer solution was treated with Amberlite® IRC-718 chelating resin, followed by Amberlyst® IR-15 dry ion exchange resin at 50° C. for 5 hours. The resulting polymer solution was filtered, concentrated, and precipitated into hexane. The precipitated polymer was filtered and dried overnight under vacuum. The overall yield of polymer was 26.1 g (52%). The polymer was further characterized using GPC, IR and NMR. The mol. wt. of the polymer was observed to be Mn=12,000 with a Mw of 26,000. IR clearly indicated the presence of acid functionality. $^1H$ NMR indicated the absence of trimethylsilyl groups and the polymer composition was very close to the initial monomer feed ratio.

EXAMPLE 28

Synthesis of Bicyclo[2.2.1]hept-5-ene-2-methyl Ethyl Carbonate/t-butylester of Norbornene/ norbornyl Carboxylic Acid/bicyclo[2.2.1]hept-5-ene-methyl Ethyl Oxalate Tetrapolymer from Tetrapolymer of Bicyclo[2.2.1]hept-5-ene-2-methyl Ethyl Carbonate/t-butylester of Norbornene/ trimethylsilyl Ester of Norbornene/bicyclo[2.2.1] hept-5-ene-methyl Ethyl Oxalate (30/30/30/10 Mole Ratio)

To a glass vial containing a stir bar was added under nitrogen atmosphere 10.31 g (0.053 mol) of bicyclo[2.2.1] hept-5-ene-2-methyl ethyl carbonate, 11.78 g (0.052 mol) bicyclo[2.2.1]hept-5-ene-methyl ethyl oxalate, 10.21 g (0.052 mol) of t-butyl ester of norbornene, 3.68 g (0.017 mol) of trimethylsilyl ester of norbornene and 110 ml of toluene. To the reaction solution at room temperature was added via syringe a nickel catalyst solution in a monomer to catalyst ratio of 100/1. The catalyst solution was prepared inside a dry box by adding 0.849 g (1.75 mmol) of $(CH_3C_6H_5)Ni(C_6F_5)_2$ in 10 ml of toluene. The polymerization was allowed to stir for 5 hours after which the polymer solution was treated with Amberlite® IRC-718 chelating resin, followed by Amberlyst® IR-15 dry ion exchange resin at 50° C. for 5 hours. The resulting polymer solution was filtered, concentrated, and precipitated into hexane. The precipitated polymer was filtered and dried overnight under vacuum. The overall yield of polymer was 29.1 g (81%). The polymer was further characterized using GPC, IR and NMR. The mol. wt. of the polymer was observed to be Mn=25,000 with a Mw of 68,000. IR clearly indicated the presence of acid functionality. $^1H$ NMR indicated the absence of trimethylsilyl groups and the polymer composition was very close to the initial monomer feed ratio.

EXAMPLE 29

Synthesis of Bicyclo[2.2.1]hept-5-ene-2-methyl Ethyl Carbonate/t-butylester of Norbornene/ norbornyl Carboxylic Acid/bicyclo[2.2.1]hept-5-ene-2-methyl Methylether Tetrapolymer from Tetrapolymer of Bicyclo[2.2.1]hept-5-ene-2-methyl Ethyl Carbonate/t-butylester of Norbornene/ trimethylsilyl Ester of Norbornene/bicyclo[2.2.1] hept-5-ene-methyl Methylether (30/30/30/10 Mole Ratio)

To a glass vial containing a stir bar was added under nitrogen atmosphere 13.1 1 g (0.067 mol) of bicyclo[2.2.1]

hept-5-ene-2-methyl ethyl carbonate, 9.23 g (0.067 mol) bicyclo[2.2.1]hept-5-ene-2-methyl methylether, 12.98 g (0.067 mol) of t-butyl ester of norbornene, 4.68 g (0.022 mol) of trimethylsilyl ester of norbornene and 110 ml of toluene. To the reaction solution at room temperature was added via syringe a nickel catalyst solution in a monomer to catalyst ratio of 100/1. The catalyst solution was prepared inside a dry box by adding 1.08 g (2.23 mmol) of $(CH_3C_6H_5)Ni(C_6F_5)_2$ in 10 ml of toluene. The polymerization was allowed to stir for 5 hours after which a solution of 0.63 g of 1,2-cyclohexanedione dioxime dissolved in 10 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, the precipitated polymer was redissolved in tetrahydrofuran and treated with Amberlyst® IR-15 dry ion exchange resin at 50° C. for 5 hours. The resulting polymer solution was filtered, concentrated, and precipitated into hexane. The precipitated polymer was filtered and dried overnight under vacuum. The overall yield of polymer was 31.7 g (79%). The polymer was further characterized using GPC, IR and NMR. The mol. wt. of the polymer was observed to be Mn=18,000 with a Mw of 35,700. IR clearly indicated the presence of acid functionality. $^1$H NMR indicated the absence of trimethylsilyl groups and the polymer composition was found to be very close to the initial monomer feed ratio.

EXAMPLE 30

Synthesis of Bicyclo[2.2.1]hept-5-ene-2-methyl Ethyl Carbonate/t-butylester of Norbornene/ norbornyl Carboxylic Acid/bicyclo[2.2.1]hept-5-ene Tetrapolymer from Tetrapolymer of Bicyclo[2.2.1]hept-5-ene-2-methyl Ethyl Carbonate/t-butylester of Norbornene/trimethylsilyl Ester of Norbornene/ bicyclo[2.2.1]hept-5-ene (50/30/10/10 Mole Ratio)

To a glass vial containing a stir bar was added under nitrogen atmosphere 20.99 g (0.107 mol) of bicyclo[2.2.1]hept-5-ene-2-methyl ethyl carbonate, 2.01 g (0.021 mol) bicyclo[2.2.1]hept-5-ene, 12.47 g (0.064 mol) of t-butyl ester of norbornene, 4.5 g (0.021 mol) of trimethylsilyl ester of norbornene and 110 ml of toluene. To the reaction solution at room temperature was added via syringe a nickel catalyst solution in a monomer to catalyst ratio of 100/1. The catalyst solution was prepared inside a dry box by adding 1.03 g (2.14 mmol) of $(CH_3C_6H_5)Ni(C_6F_5)_2$ in 10 ml of toluene. The polymerization was allowed to stir for 5 hours after which a solution of 0.61 g of 1,2-cyclohexanedione dioxime dissolved in 10 ml of acetone was added to chelate the Ni catalyst. The chelated Ni complex was observed to precipitate immediately. The solution was stirred overnight, filtered to remove the chelated complex, and the filtrate was concentrated and finally poured into methanol to precipitate the polymer. In order to remove the trimethylsilyl protecting group, the precipitated polymer was redissolved in tetrahydrofuran and treated with Amberlyst® IR-15 dry ion exchange resin at 50° C. for 5 hours. The resulting polymer solution was filtered, concentrated, and precipitated into hexane. The precipitated polymer was filtered and dried overnight under vacuum. The overall yield of polymer was 34.5 g (86%). The polymer was further characterized using GPC, IR and NMR. The mol. wt. of the polymer was observed to be Mn=20,000 with a Mw of 46,700. IR clearly indicated the presence of acid functionality. $^1$H NMR indicated the absence of trimethylsilyl groups and the polymer composition was found to be very close to the initial monomer feed ratio.

EXAMPLE 31

Introduction of Tetrahydropyranyl Protecting Group from Bicyclo[2.2.1]hept-5-ene-2-methyl Ethyl Carbonate/t-butylester of Norbornene/norbornyl Carboxylic Acid Terpolymer (50/25/25 Mole Ratio)

Into a 50 ml flask containing a stir bar is added under nitrogen atmosphere 5 g of carboxylic acid terpolymer obtained from Example 24, 3 gms of Amberlyst® IR-15 dry ion exchange resin and 15 ml of tetrahydrofuran. To the reaction solution at room temperature is added via syringe 8 ml of dihydropyran. The solution is slowly heated to reflux for 5 hours. The resulting polymer solution is cooled, filtered, concentrated, and precipitated into hexane. The precipitated polymer is filtered and dried overnight under vacuum. The resin obtained is analyzed via IR. The acid functionality in the polymer is expected to undergo an esterification reaction to yield a tetrahydropyranyloxycarbonyl group.

EXAMPLE 32

Synthesis of Bicyclo[2.2.1]hept-5-ene-2-methyl Carbonate/t-butylester of Norbornene/endonadic Anhydride Terpolymer and Post Modification of Anhydride Functionality to Aliphatic Imide Functionality (50/40/10 Mole Ratio)

To a glass vial containing a stir bar was added under nitrogen atmosphere 1.56 g (7.95 mmol.) of bicyclo[2.2.1]hept-5-ene-2-methyl ethyl carbonate, 12.64 g (0.054 mmol) ethyl ester of tetracyclododecene, 1.23 g (6.36 mmol) of t-butyl ester of norbornene, 0.26 g (1.59 mmol) of freshly dried endonadic anhydride in 5 ml of toluene. To the reaction solution at room temperature was added via syringe a nickel catalyst solution in a monomer to catalyst ratio of 200/1. The catalyst solution was prepared inside a dry box by adding 0.0383 g (0.08 mmol) of $(CH_3C_6H_5)Ni(C_6F_5)_2$ in 5 ml of toluene. The polymerization was allowed to stir for 5 hours after which the polymer solution was treated with 0.023 g of 1,2-cyclohexanedione dioxime dissolved in 10 ml of acetone, to chelate the Ni catalyst. The chelated Ni complex was observed to precipitate immediately. The solution was stirred overnight, filtered to remove the chelated complex, and the filtrate was concentrated and finally poured into methanol to precipitate the polymer. The precipitated polymer was redissolved in tetrahydrofuran and treated with Amberlyst® IR-15 dry ion exchange resin at 50° C. for 5 hours. The resulting polymer solution was filtered, concentrated, and precipitated into hexane. The precipitated polymer was filtered and dried overnight under vacuum. The overall yield of polymer was 1.1 g (36%). The polymer was characterized using GPC, IR and NMR. The mol. wt. of the polymer was observed to be Mn=23,000 with a Mw of 49,000. IR clearly indicated the presence of anhydride functionality. $^1$H NMR indicated the polymer composition was very close to the initial monomer feed ratio.

EXAMPLE 33

The polymer obtained in Example 32 is further post functionalized to amic acid by reacting with aliphatic amines such as cyclohexyl amine. Into a 50 ml flask containing a stir bar is added under nitrogen atmosphere 1 g of anhydride containing terpolymer and 15 ml of tetrahydrofuran. To the reaction solution at room temperature is added via syringe 5 ml of cyclohexyl amine. The solution is stirred at room temperature for 5 hours. The resulting polymer solution is cooled, and chemically imidized using acetic anhydride, pyridine mixture at 60° C., and is precipitated into methanol. The precipitated polymer is filtered and dried overnight under vacuum.

EXAMPLE 34

Reaction of 4-Hydroxybenzyl Alcohol with Poly (norbornene Methanol-co-t-butyl Ester of Norbornene) (50/50 Mole Ratio)

To a 100 ml round-bottom flask containing a stir bar was added 1.35 g of copolymer and 20 ml of THF. Once the polymer was dissolved, 4-hydroxybenzyl alcohol (0.67 g. 5 mmol) was added. The reactants were stirred at room temperature for 10 minutes to ensure complete dissolution. The HCL (4 drops) was added to the solution. The reaction was allowed to stir for 20 hours at room temperature. The polymer was isolated by precipitating into water, filtering, and drying in a vacuum oven set at 80° C. for 24 hours. The yield of the resulting polymer was quantitative. NMR and IR confirmed the attachment of the benzyl group to the polymer.

EXAMPLE 35

Reaction of 1-Adamantane Isocyanate with Poly (norbornene Methanol-co-t-butyl Ester of Norbornene) (50/50 Mole Ratio)

Poly(norbornene methanol-co-t-butyl ester of norbornene) (2 g) and 1-adamantane isocyanate (1.4 g) were added to a 100 ml round-bottom flask. The solids were dissolved in THF (30 ml) and the flask fitted with a reflux condenser, stir bar, and positive nitrogen inlet. The resulting clear colorless solution was refluxed for 5 hours. Then the flask was allowed to cool to room temperature, the contents precipitated into water (200 ml), filtered, and dried in vacuum for 24 hours. Yield=2.66 g.

The following examples demonstrate that a number of imaging factors can be improved with the post-functionalization addition of pendant carboxylic acid groups to the polycyclic backbone. Resist formulations were prepared as follows: The exemplified polymers and a photoacid generator were dissolved in the casting solvent propylene glycol methyl ether acetate (PGMEA). The resist formulations were spin coated onto silicon wafers and baked a 130° C. for 1 minute. The coated wafers were then exposed through a binary mask at 193 nm in the ISI ArF Microstep 0.6 NA. After exposure the wafers were baked a second time at 150° C. for 1 minute and developed for 20 seconds with a 0.21N tetramethylammoniumhydroxide (TMAH) solution.

EXAMPLE 36

Resist compositions and coated wafers were prepared as described above except that the temperature of the first bake for the copolymer devoid of carboxylic acid moieties was 150° C. An SEM micrograph of an imaged and developed photoresist polymer containing a carboxylic acid moiety introduced by post-functionalization was compared to an SEM micrograph of a photoresist polymer devoid of a carboxylic acid containing moieties. The carboxylic acid containing polymer was the terpolymer obtained in Example 20 containing repeating units having pendant oxalate/t-butyl ester/acid groups in a mole percent ratio of 50/40/10. The terpolymer is represented as follows:

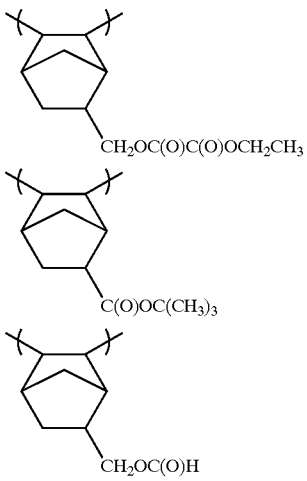

oxalate/t-butyl ester/carboxylic acid containing terpolymer 50/40/10

The polymer devoid of carboxylic functionality was a copolymer containing repeating units having pendant oxalate/t-butyl ester groups in a mole percent ratio of 50/50. The copolymer is represented below:

oxalate/t-butyl ester copolymer 50/50

Figure 2:
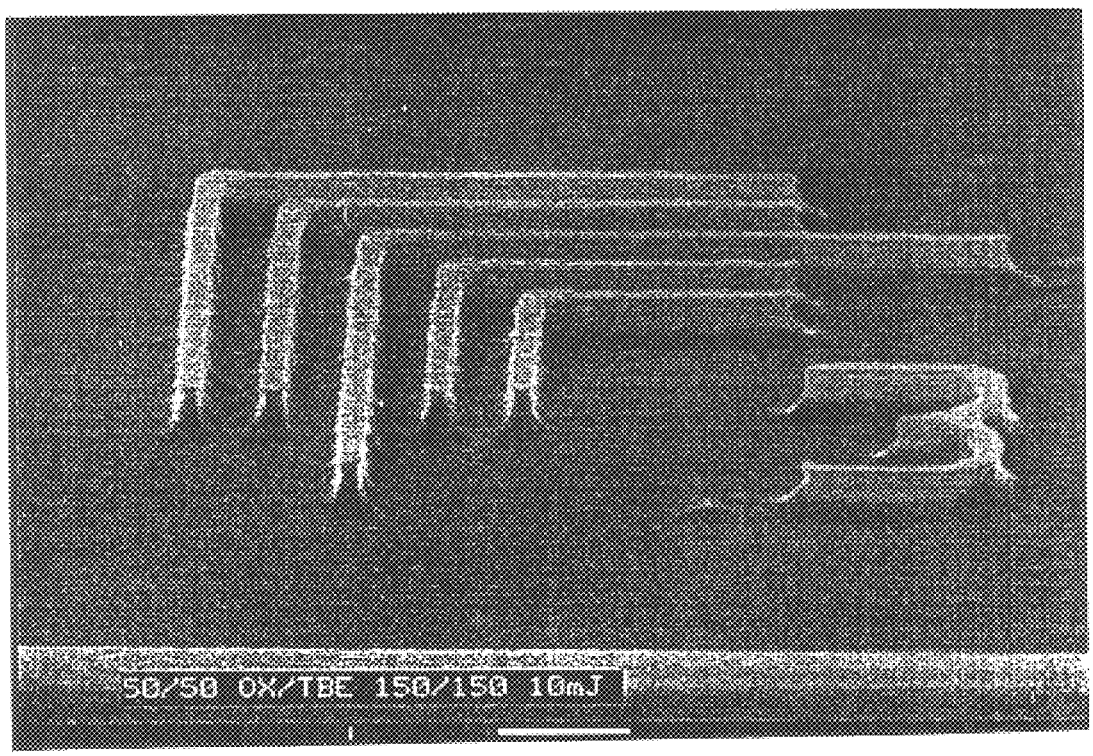
FIG. 2 is a SEM micrograph of a printed image on a resist polymer of the invention containing 10 mole percent of repeating units having pendant carboxylic acid functionality at 0.30 micron feature resolution.

As shown in FIG. 1, the imaged 50/40/10 resist terpolymer at 0.15 micron feature size exhibits clean development and sharp resolution. In sharp contrast, as shown in FIG. 2, the 50/50 copolymer at a relatively higher 0.3 micron feature size, exhibits very rough development with scum visible in the large pads of exposed areas.

EXAMPLE 37

In this example a copolymer devoid of carboxylic acid functionality containing repeating units having pendant carbonate groups and pendant t-butyl ester groups (50/50 mole percent) was compared to terpolymers containing repeating units having pendant carbonate/t-butyl ester/carboxylic acid groups of 50/40/20 mole percent and 40/40/20 mole percent. Imaging experiments and contact angle measurements of the polymers were conducted as set forth below. The polymers are represented below:

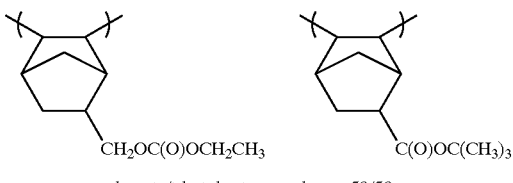

carbonate/t-butyl ester copolymer 50/50

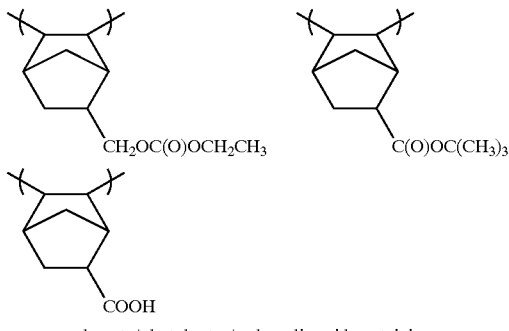

carbonate/t-butyl ester/carboxylic acid containing
terpolymer 50/40/10 and 40/40/20

Through the post-functionalization incorporation of carboxylic acid functionality into the polymer backbone the dissolution properties and hydrophilicity of the polymer can be controlled. The contact angle between the surface of each polymer and a droplet of water was measured and is reported in the table below. Contact angle is a good indicator of the hydrophilicity of the polymer.

Contact angle measurements were determined as follows:

The polymers were dissolved in PGMEA and then filtered through a 0.45 micron Teflon® membrane. The filtered solution was spin-coated onto a clean silicon wafer and baked at 140° C. for 2 minutes to dry the film.

The coated wafers were placed on AST Products VCA video contact angle goniometer which measures the angle of the tangency of the droplet profile to the surface of the polymer film. Pure water (2 μl) was syringed onto the surface of the coated wafer using a high precision syrine pump. The water droplet contact angle was measured within 2 or 3 seconds of placing the droplet on the coated wafer surface. Duplicate tests were run for each sample to ensure accuracy.

| Polymer Composition Carbonate/t-butyl ester/Acid | Mole % of Repeating Unit Containing Acid Functionality | Contact Angle | Polymer Example |
|---|---|---|---|
| 50/50/0 | 0 | 78° | — |
| 50/40/10 | 10 | 74° | 22 |
| 40/40/20 | 20 | 69° | 23 |

The contact angle correlated well with observations of greatly enhanced wetting during lithography processing. The lower the contact angle, the better the hydrophilic properties of the polymer.

Figure 3:
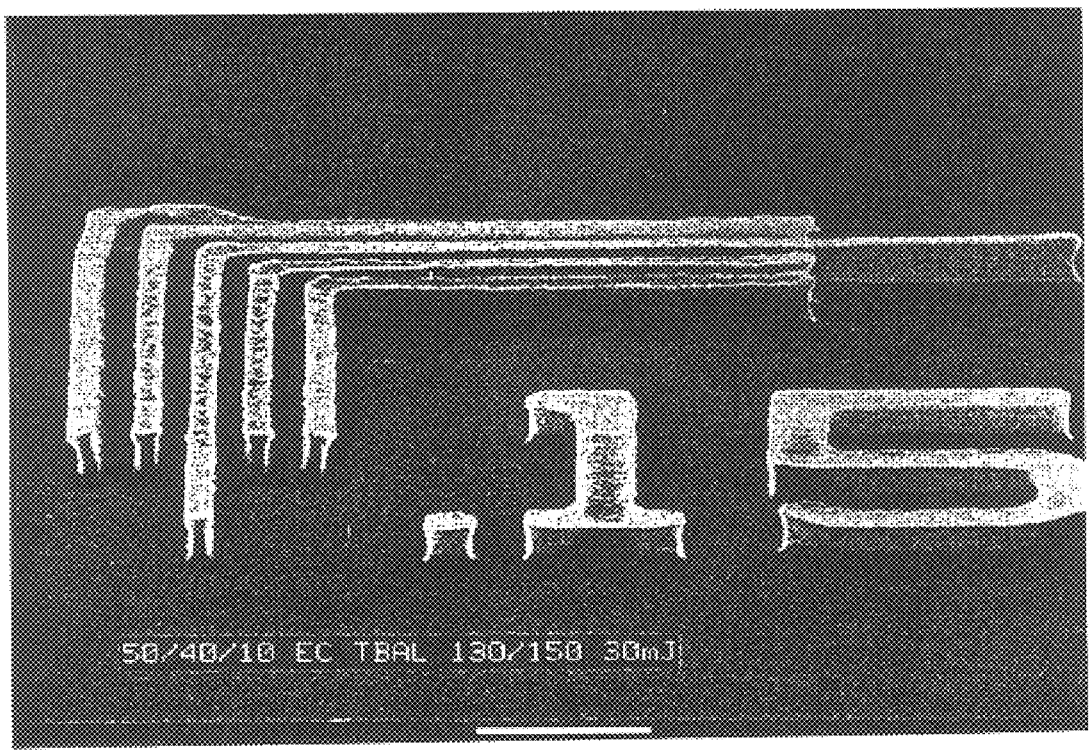
FIG. 3 is a SEM micrograph of a printed image on a resist polymer of the invention containing 10 mole percent of repeating units having pendant carboxylic acid functionality at 0.15 micron feature resolution and a 1:1 pitch.
Figure 4:
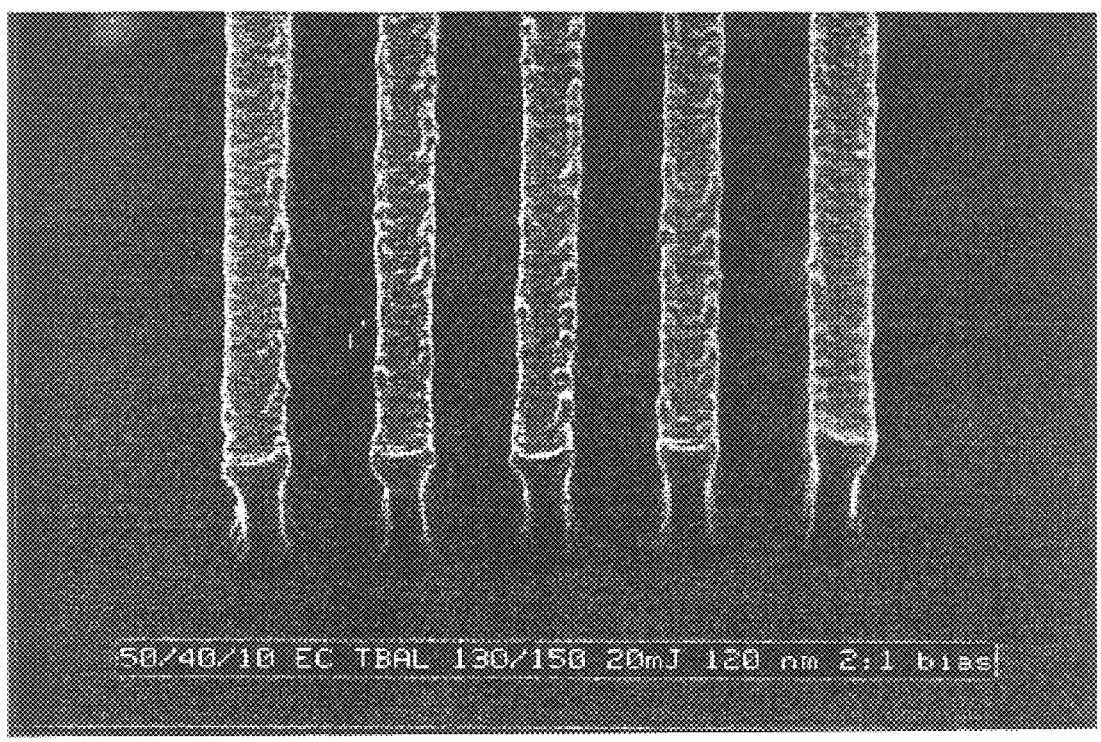
FIG. 4 is a SEM micrograph of a printed image on a resist polymer of the invention containing 10 mole percent of repeating units having pendant carboxylic acid functionality at 0.12 micron feature resolution and a 2:1 pitch.

The polymers were formulated into resist compositions and imaged as set forth above. The results of the imaging experiments demonstrated the enormous impact of the post-functionalization incorporation of carboxylic functionality on lithography performance. The 50/50 copolymer (devoid of carboxylic acid functionality) showed a high level of scum, adhesion loss, and poor imaging. Images below 0.45 microns were not obtainable (Fig. not included). Upon the addition of a carboxylic acid containing moiety (i.e., the 50/40/10 polymer of Example 22), a significant lowering of feature sizes was possible. FIGS. 3 and 4 show SEM micrographs of 1:1 pitched 0.15 micron and 2:1 pitched 0.12 micron images, respectively. of the polymer of Example 22. Pitch is the ratio of the spacing between the feature lines to the width of the feature lines. As is illustrated in these figures, well defined, clean images were printed.

Figure 5:
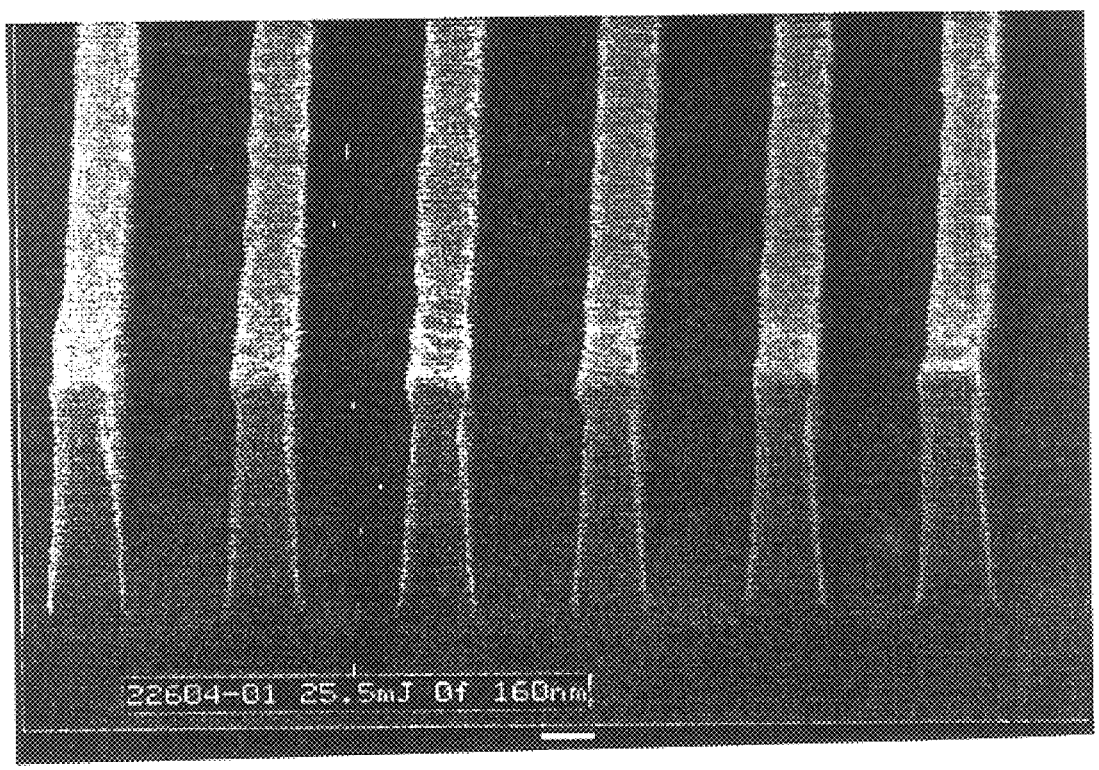
FIG. 5 is a SEM micrograph of a printed image on a resist polymer of the invention containing 20 mole percent of repeating units having pendant carboxylic acid functionality at 0.16 micron feature resolution and a 1:1 pitch.
Figure 6:
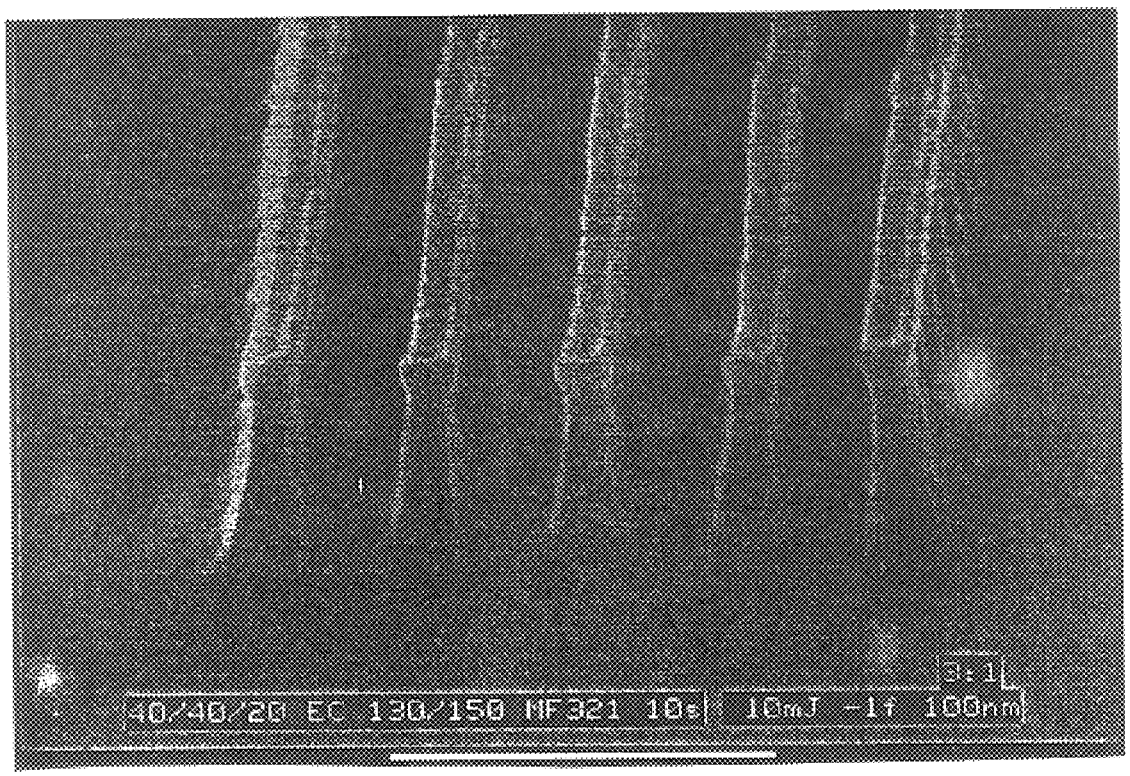
FIG. 6 is a SEM micrograph of a printed image on a resist polymer of the invention containing 20 mole percent of repeating units having pendant carboxylic acid functionality at 0.10 micron feature resolution and a 3:1 pitch.

Upon the addition of more carboxylic acid containing moiety (i.e., the 40/40/20 polymer of Example 23), the imaging was improved even further. As shown in FIG. 5 (0.16 micron feature size at 1:1 pitch), the feature profiles became much sharper and the bottoms of the features were much cleaner (less scum). FIG. 6 (0.10 micron feature size at 3:1 pitch) demonstrates that even smaller features are easily printed.

These examples demonstrate that increased hydrophilicity brought about by the post-functionalization incorporation of carboxylic acid containing moieties, leads to vast increases in imaging quality, both in feature sizes and profile aesthetics.

What is claimed is:

1. A polymer containing a cyclic backbone said backbone comprises a pendant acid labile functional group and a protected functional group containing a protected hydroxyl moiety, said protected hydroxyl moiety containing a protecting group capable of selective removal by deprotection agents that do not attack said acid labile functional groups.

2. The polymer of claim 1 wherein said pendant acid labile functional group is terminated with an ester moiety containing an acid labile group selected from dicyclopropylmethyl, dimethylcyclopropylmethyl, —C(CH$_3$)$_3$, —CH(R$_p$) OCH$_2$CH$_3$, —CH(R$^P$)OC(CH$_3$)$_3$, or a cyclic group represented by one of the following structures:

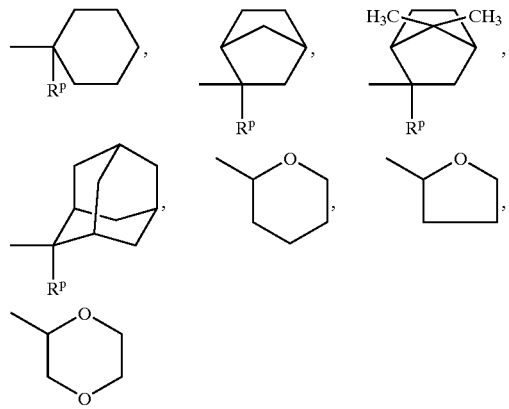

;or mixtures thereof, wherein R$^P$ represents hydrogen or a linear or branched (C$_1$ to C$_5$) alkyl group; and said protected functional group contains a silyl protected hydroxyl moiety or a methyl carbonyl protected hydroxyl moiety.

3. The polymer of claim 2 wherein said protected functional group is represented by a radical of the formula —(CH$_2$)$_n$OG, —(CH$_2$)$_n$C(O)OG', or —(CH$_2$)$_n$—(C$_6$ to C$_{14}$) aryl—OG wherein n is an integer from 0 to 10 and G is a silyl protecting group of the formula -Si(R$^{15}$)$_3$ wherein R$^{15}$ independently represents linear or branched (C$_1$ to C$_{10}$) alkyl, (C$_6$ to C$_{14}$) aryl, or substituted (C$_6$ to C$_{14}$) aryl wherein said substituents are selected from linear or branched (C$_1$ to C$_5$) alkyl groups; and G' represents G or —C(O)CH$_3$.

4. A polymer comprising cyclic repeating units wherein a portion of said repeating units contain pendant acid labile groups and another portion of said repeating units contain pendant protected functional groups, said acid labile containing repeating units are represented by the structure:

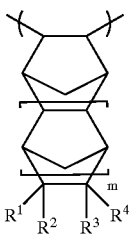

m is an integer from 0 to 10, wherein $R^1$ to $R^4$ independently represent a substituent selected from —(A)$_n$C(O)OR*, —(A)$_n$—C(O)OR, —(A)$_n$—OR, —(A)$_n$—OC(O)R, —(A)$_n$—C(O)R, —(A)$_n$—OC(O)OR, —(A)$_n$—OCH$_2$C(O)OR*, —(A)$_n$—C(O)O—A'—OCH$_2$C(O)OR*, —(A)$_n$—OC(O)—A'—C(O)OR*, —(A)$_n$—C(R)$_2$CH(R)(C(O)OR), or —(A)$_n$—C(R)$_2$CH(C(O)OR)2 subject to the proviso that at least one of $R^1$ to $R^4$ is selected from an acid labile group containing R*; A and A' independently represent a divalent bridging or spacer radical selected from divalent hydrocarbon radicals selected from linear or branched (C$_1$ to C$_{10}$) alkylene; divalent cyclic hydrocarbon radicals selected from substituted or unsubstituted (C$_3$ to C$_8$) cycloaliphatic moieties of the formula:

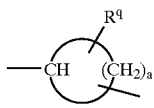

wherein a is an integer from 2 to 7 and $R^q$ if present represents linear or branched (C$_1$ to C$_{10}$) alkyl groups; divalent oxygen containing radicals selected from (C$_2$ to C$_{10}$) alkylene ethers and polyethers of the formula:

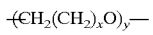

wherein x is an integer from 1 to 5 and y is an integer from 2 to 50, with the proviso that the terminal oxygen atom on the polyether spacer moiety can not be directly linked to a terminal oxygen atom on an adjacent group to form a peroxide linkage; or divalent cyclic ethers and cyclic diethers represented by the structures:

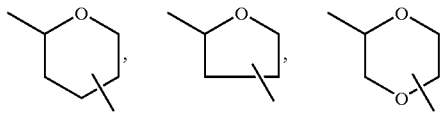

R represents a group selected from linear or branched (C$_1$ to C$_{10}$) alkyl; and R* is acid labile group selected from dicyclopropylmethyl, dimethylcyclopropylmethyl, —C(CH$_3$)$_3$, —CH(R$^P$)OCH$_2$CH$_3$, —CH(R$^P$)OC(CH$_3$)$_3$, or a cyclic group represented by one of the following structures:

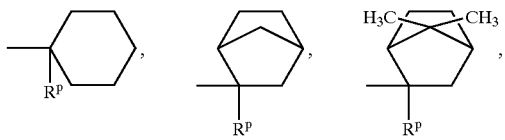

-continued

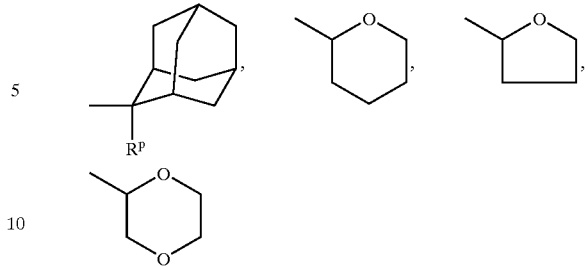

;or mixtures thereof, wherein R$^P$ represents hydrogen and a linear or branched (C$_1$ to C$_5$) alkyl group; and said protected functional group containing repeating units are represented by the structure:

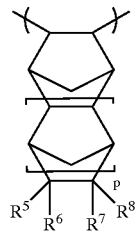

wherein p is an integer from 0 to 5; $R^5$ to $R^8$ independently represent hydrogen, linear or branched (C$_1$ to C$_{20}$) alkyl, —(CH$_2$)$_n$C(O)OR, —(CH$_2$)$_n$OR, —(CH$_2$)$_n$OC(O)R, —(CH$_2$)$_n$C(O)R, or —(CH$_2$)$_n$OC(O)OR, wherein R is linear or branched (C$_1$ to C$_{10}$) alkyl, subject to the proviso that at least one of $R^5$ to $R^8$ is selected from a protected functional group represented by —(CH$_2$)$_n$OG, —(CH$_2$)$_n$C(O)OG, or —(CH$_2$)$_n$—(C$_6$ to C$_{14}$)aryl—OG', wherein n is an integer from 0 to 10, and G is a protecting group selected from the radical —Si(R$^{15}$)$_3$, wherein $R^{15}$ independently represents linear or branched (C$_1$ to C$_{10}$) alkyl, (C$_6$ to C$_{14}$) aryl, or substituted (C$_6$ to C$_{x4}$) aryl wherein said substituents are selected form linear or branched (C$_1$ to C$_5$) alkyl groups, and G' represents G or —C(O)CH$_3$.

5. The polymer of claim 4 further comprising a repeating unit represented by the structure:

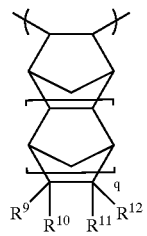

wherein q is an integer from 0 to 5; $R^9$ to $R^{12}$ independently represent hydrogen, linear or branched (C$_1$ to C$_{10}$) alkyl, or a substituent selected from —(A)$_n$—C(O)OR", —(A)$_n$—OR", —(A)$_n$—OC(O)R", —(A)$_n$—OC(O)OR",—(A)$_n$—C(O)R", —(A)$_n$—OC(O)C(O)OR", —(A)$_n$—O—A'—C(O)OR", —(A)$_n$—OC(O)—A'—C(O)OR", —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR", —(A)$_n$—C(O)O—A'—OC(O)C(O)OR", —(A)$_n$—C(R')$_2$CH(R')(C(O)OR'), or —(A)$_n$—C(R')$_2$CH(C(O)OR')$_2$, $R^9$ and $R^{12}$ can be taken together with the ring carbon atoms to which they are attached to represent a cyclic anhydride group; A and A' independently represent a divalent bridging or spacer radical selected from divalent hydrocarbon radicals selected from linear or branched ($C_1$ to $C_{10}$) alkylene; divalent cyclic hydrocarbon radicals selected from substituted or unsubstituted ($C_3$ to $C_8$) cycloaliphatic moieties of the formula:

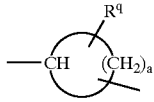

wherein "a" is an integer from 2 to 7 and $R^q$ if present represents linear or branched ($C_1$ to $C_{10}$) alkyl groups; divalent oxygen containing radicals selected from ($C_2$ to $C_{10}$) alkylene ethers or polyethers of the formula:

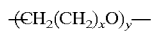

wherein x is an integer from 1 to 5 and y is an integer from 2 to 50, with the proviso that the terminal oxygen atom on the polyether spacer moiety can not be directly linked to a terminal oxygen atom on an adjacent group to form a peroxide linkage; and divalent cyclic ethers and cyclic diethers represented by the structures:

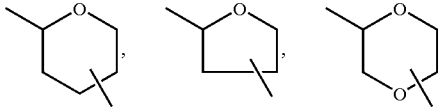

R" independently represents, linear and branched ($C_1$ to $C_{10}$) alkyl, linear or branched ($C_1$ to $C_{10}$) alkoxyalkylene, polyethers, monocyclic or polycyclic ($C_4$ to $C_{20}$) cycloaliphatic moieties, cyclic ethers, cyclic ketones, or cyclic esters.

* * * * *